(12) United States Patent
Fukunaka et al.

(10) Patent No.: US 7,193,288 B2
(45) Date of Patent: Mar. 20, 2007

(54) MAGNETOELECTRIC TRANSDUCER AND ITS MANUFACTURING METHOD

(75) Inventors: Toshiaki Fukunaka, Nobeoka (JP); Atsushi Yamamoto, Nobeoka (JP)

(73) Assignee: Asahi Kasei Electronics Co., Ltd., Tokyo (JP)

( * ) Notice: Subject to any disclaimer, the term of this patent is extended or adjusted under 35 U.S.C. 154(b) by 0 days.

(21) Appl. No.: 10/965,952

(22) Filed: Oct. 18, 2004

(65) Prior Publication Data

US 2005/0086794 A1    Apr. 28, 2005

Related U.S. Application Data

(63) Continuation of application No. PCT/JP03/04996, filed on Apr. 18, 2003.

(30) Foreign Application Priority Data

Apr. 19, 2002  (JP)  ............... 2002-118141
Jan. 31, 2003  (JP)  ............... 2003-024947

(51) Int. Cl.
  *H01L 29/82* (2006.01)
  *H01L 43/00* (2006.01)
(52) U.S. Cl. .............. 257/425; 257/422; 257/423; 257/427; 257/E27.005; 257/E27.006; 365/158
(58) Field of Classification Search ........ 257/422–425, 257/427, 679, 693, 692, E27.005, E27.006; 365/158
See application file for complete search history.

(56) References Cited

U.S. PATENT DOCUMENTS 4,908,685 A    3/1990  Shibasaki et al.

(Continued)

FOREIGN PATENT DOCUMENTS

JP    51-045234    12/1976

(Continued)

OTHER PUBLICATIONS

Co-Pending U.S. Appl. No. 10/546,825; Title: Semiconductor Sensor and Method for Manufacturing the Same; filed Oct. 18, 2004.

(Continued)

*Primary Examiner*—Kenneth Parker
*Assistant Examiner*—Joseph Nguyen
(74) *Attorney, Agent, or Firm*—Finnegan, Henderson, Farabow, Garrett & Dunner, L.L.P.

(57) ABSTRACT

A ultrathin magnetoelectric transducer and its manufacturing method are provided which enable the quality of mounting to be inspected nondestructively, and can reduce a footprint. The magnetoelectric transducer has a substrate composed of a nonmagnetic substrate, and includes bottom surface connecting electrodes whose leads have a first thickness, and side electrodes which are exposed by dicing and have the first thickness. A more sensitive Hall element has a high-permeability magnetic substrate as the substrate, and includes the bottom surface connecting electrodes whose leads have the first thickness, and the side electrodes exposed by the dicing and having the first thickness. The bottom surface connecting electrodes of the leads with the first thickness are formed across the internal electrodes of adjacent magnetoelectric transducers with maintaining the first thickness. The side electrodes with the first thickness are formed by cutting the center between the adjacent magnetoelectric transducers.

18 Claims, 44 Drawing Sheets

U.S. PATENT DOCUMENTS 6,724,059 B2 * 4/2004 Fukunaka ................ 257/427

FOREIGN PATENT DOCUMENTS

| | | |
|---|---|---|
| JP | 1-13211 | 10/1982 |
| JP | 1-15135 | 11/1982 |
| JP | 2-47849 | 5/1983 |
| JP | 3-59571 | 1/1984 |
| JP | 60-037183 | 2/1985 |
| JP | 7-13987 | 12/1986 |
| JP | 01-100443 | 7/1989 |
| JP | 02-033585 | 3/1990 |
| JP | 07-249577 A | 9/1995 |
| JP | 10-233539 A | 9/1998 |
| JP | 11-121830 * | 4/1999 |
| JP | 11-233849 | 6/1999 |
| JP | 11-251657 A | 9/1999 |
| JP | 2000-101162 | 4/2000 |
| JP | 2000-150983 | 5/2000 |
| JP | 2002-107382 | 4/2002 |
| JP | 2002-289973 A | 10/2002 |
| JP | 2002-299599 A | 10/2002 |

OTHER PUBLICATIONS

"National Technical Report", (1996), vol. 42, No. 4, pp. 84-92.
Translation of Patent Abstracts of Japan for JP 2002-009364 A.

* cited by examiner

MAGNETOELECTRIC TRANSDUCER AND ITS MANUFACTURING METHOD

This application claims priority from Japanese Patent Application Nos. 2002-118141 filed Apr. 19, 2002 and 2003-024947 filed Jan. 31, 2003, which are incorporated hereinto by reference. In addition, this application is a continuation application of International Application No. PCT/JP03/04996 filed Apr. 18, 2003 designating the U.S.

TECHNICAL FIELD

The present invention relates to a magnetoelectric transducer and its manufacturing method, and more particularly to a ultrathin, small-footprint, compact magnetoelectric transducer and a ultrathin, vertically mountable, compact magnetoelectric transducer, and their manufacturing method.

BACKGROUND ART

Magnetoelectric transducers such as a Hall-effect element, a Hall IC, magnetoresistance element, ferromagnetic resistance element and magnetoresistance IC are widely used as a rotational position detecting sensor of a driving motor of a VTR, floppy (trademark) disk, CD-ROM, DVD, CPU fan etc., and as a switch or encoder in combination with a permanent magnet. As these electronic components shrink, the need for reducing the thickness and footprint of the magnetoelectric transducer has intensified.

In addition, the need for reducing the size and thickness has intensified in the applications to motors that detect the magnetic flux density not only perpendicular to, but also parallel to the mounting surface of the magnetoelectric transducer, because the latter has an advantage of increasing the degree of freedom of the magnetic flux detection position.

One of the most common magnetoelectric transducers is a Hall element fabricated through the process of attaching a magnetoelectric transducer, which is composed of a magneto-sensitive semiconductor thin film including internal electrodes, to a section called an island of a lead frame; of connecting the internal electrodes to the lead frame via metal wires; and of molding the magnetoelectric transducer and part of the lead frame with a resin, followed by other processing such as trimming, forming and electromagnetic test.

FIGS. 44A and 44B show an outline of a rather small example of a conventional Hall element thus fabricated: FIG. 44A is a side view; and FIG. 44B is a plan view. Its height h is 0.8 mm, width w is 1.25 mm, and the length L and width W including the lead frame are 2.1 mm each. The smallest Hall element formed with a lead frame currently on the market has an exterior size with the projected dimensions of 2.5×1.5 mm and the height of 0.6 mm including the lead frame constituting the external electrodes in the package, or an exterior size with the projected dimensions of 2.1×2.1 mm and the height of 0.55 mm. These Hall elements are characterized by being small in height.

A Hall element currently on the market capable of detecting the component of the horizontal magnetic flux density has an exterior size with the projected dimensions of 2.7×2.1 mm and the height of 1.45 mm including the lead frame constituting the external electrodes in the package. It is characterized in that the island of the lead frame, to which the magnetoelectric transducer is attached, is inclined 45° with respect to the mounting surface (see, Japanese utility application laying-open No. 2-033585 (1990)).

However, the foregoing constructions have their limits, particularly to the miniaturization and slimming down of the projected area. Although the magnetoelectric transducer is molded and the mold dimension itself can be reduced to about 1.5×1.5 mm, the lead frame extending out of the mold must be formed, and the extended portion imposes a limit to the miniaturization. In addition, the loop height of the metal wires also hampers the slimming down. Although a method is known of erecting the island of the lead frame vertically to detect the horizontal magnetic flux density, it must protrude the lead frame from the upper section of the mold and bend. Thus, the length of the island of the lead frame and the part of the lead frame at the upper section of the mold hamper the slimming down.

The present invention is implemented from the idea to reduce the dimensions of the magnetoelectric transducer in its entirety including the mounting electrodes to about the mold dimensions without using the metal wires.

The present invention is implemented in view of the foregoing conditions. Therefore an object of the present invention is to provide a magnetoelectric transducer and its manufacturing method including a ultrathin, small-footprint, compact magnetoelectric transducer, and a ultrathin, compact magnetoelectric transducer with a vertical mounting type capable of detecting the magnetic flux density differing by 90° in the direction.

DISCLOSURE OF THE INVENTION

According to one aspect of the present invention, there is provided a magnetoelectric transducer comprising: a substrate on which a magneto-sensitive section and internal electrodes are formed; leads mounted on the internal electrodes, each of the leads including at least a first thickness region and a second thickness region, where the first thickness is greater than the second thickness; a resin for sealing the magneto-sensitive section, the internal electrodes and part of the leads, which are formed on a surface of the substrate; and external connecting terminals, each of which is formed on an exposed surface of the first thickness region of the leads.

The sides at which the internal electrodes are electrically connected to the leads may be sealed by a resin.

Cross sections of the leads with inconstant thickness ranging from a minimum thickness to a maximum thickness of the leads may be exposed to side surfaces. In addition, surfaces of the leads on a side on which the internal electrodes are connected to the leads, and surfaces of the leads exposed for establishing electrical connection to the outside in mounting may both have a vertical cross section with a thickness equal to the first thickness of the leads. Here, the leads may have no portions protruding from the sides, and the leads may each have a side surface consisting of a cut cross section.

The exposed surfaces of the leads may be covered with a metal coating.

In addition, the internal electrodes may be electrically connected to the leads via a conductive resin or metal.

The substrate may be composed of a high-permeability magnetic material, wherein a surface of the high-permeability magnetic material may be covered with a magneto-sensitive thin film, a high-permeability magnetic chip may be mounted on the magneto-sensitive thin film, and the magneto-sensitive thin film may be sandwiched by the substrate composed of the high-permeability magnetic material and the high-permeability magnetic chip. The high-permeability magnetic chip mounted on the magneto-sensitive thin film may have a thickness equal to or less than the first thickness of the leads, and be interposed into a space between planes of the leads.

Furthermore, the substrate may be composed of a non-magnetic substrate such as an inorganic substrate, glass substrate and semiconductor substrate, and is covered with a magneto-sensitive thin film. In addition, the substrate may be composed of a semiconductor substrate in which semiconductor elements are formed, and the semiconductor substrate may have a magneto-sensitive thin film formed thereon. Furthermore, the magneto-sensitive thin film may be formed by doping. Moreover, the substrate may be a semiconductor substrate including the semiconductor elements and a magneto-sensitive section formed by doping.

The magneto-sensitive section may have a distortion buffer layer formed thereon, on which a resin may be further formed.

The magnetoelectric transducer in accordance with the present invention may be nearly rectangular, and the surfaces of the leads, which constitute the first thickness regions to be used as the electrically connecting terminals with the outside, may each be exposed in adjacent to and in parallel with a side of a surface of the rectangular, and another side surface adjacent to the side may constitute a mounting surface. Alternatively, the magnetoelectric transducer may be nearly rectangular, and the surfaces of the leads, which constitute the first thickness regions to be used as the electrically connecting terminals with the outside, may each be exposed in adjacent to and in parallel with a side of a surface of the rectangular, and the exposed portions of the leads on the side of the surface may be cut.

The foregoing magnetoelectric transducer can be manufactured by the following method.

First, a magneto-sensitive thin film is formed on a surface of a substrate, and a number of magnetoelectric transducers are formed collectively on the magneto-sensitive thin film by forming the patterns of multiple magneto-sensitive sections and internal electrodes composed of a metal.

Second, lead frames are connected onto the internal electrodes of the number of magnetoelectric transducers via a conductive resin or metal, the lead frames each having at least a first thickness region and a second thickness region that is thinner than the first thickness.

Third, the magneto-sensitive sections, the internal electrodes, and part of the lead frames, which are formed on the surface of the substrate, are sealed.

Finally, the dicing is carried out at a pitch at which the magnetoelectric transducers are formed to separate the number of magnetoelectric transducers.

The manufacturing method may further comprise between the step of forming the number of magnetoelectric transducers collectively, and the step of placing the lead frames, the step of placing rectangular high-permeability magnetic materials collectively on the number of magneto-sensitive sections via an adhesive layer.

The manufacturing method may further comprise the step of exposing the first thickness regions of the lead frames after the step of sealing the magneto-sensitive sections, the internal electrodes and part of the lead frames, which are formed on the surface of the substrate.

The manufacturing method may further comprise the step of applying a metal coating suitable for soldering to exposed sections of the first thickness regions of the lead frames, and to cross sections of the lead frames exposed to side surfaces.

According to another aspect of the present invention, there is provided a manufacturing method of a magnetoelectric transducer comprising: the step of forming a magneto-sensitive thin film on a surface of the substrate, and of forming a number of magnetoelectric transducers collectively by forming, on the magneto-sensitive thin film, patterns of multiple magneto-sensitive sections and internal electrodes composed of a metal; the step of placing rectangular high-permeability magnetic chips on the number of magneto-sensitive sections via a resin; the first separating step of separating the large number of magnetoelectric transducers by affixing a tape on the substrate, and by carrying out dicing at a pitch at which the magnetoelectric transducers are formed; the step of linking lead frames to the internal electrodes of the number of magnetoelectric transducers via a conductive resin or metal, the lead frames each having at least two thicknesses; the step of removing the tape used in the first separating step; the step of affixing a heat-resistant tape to surfaces of the lead frames; the step of injecting a resin from a bottom surface or side surfaces of the substrate to seal collectively; the step of removing the heat-resistant tape; and the second separating step of separating the large number of magnetoelectric transducers by carrying out dicing again at a pitch at which the magnetoelectric transducers are formed.

The manufacturing method may further comprise, between the first separating step and the step of linking the lead frames, the step of fitting the number of magnetoelectric transducers, which are separated, into a number of cavities formed in a tray with aligning directions of the magnetoelectric transducers utilizing a mounting structure; and the step of sealing collectively by injecting a resin from a bottom surface or side surfaces of the substrate.

The manufacturing method may further comprise the step of applying a coating of a metal suitable for soldering to the exposed sections of the first thickness regions of the lead frames and to the exposed sections of the cross sections of the lead frames.

The magnetoelectric transducer in accordance with the present invention with the foregoing structure can implement a very compact, thin magnetoelectric transducer with such a size as 0.7×0.9 mm projected dimensions and 0.35 mm in height, or a ultrathin, vertical magnetoelectric transducer with such a size as 2.3×0.7 mm projected dimensions and 0.6 mm in height by a simple method.

As for a Hall element, an example of the magnetoelectric transducer in accordance with the present invention, the magneto-sensitive thin film constituting the magnetoelectric transducer can be selected from compound semiconductors such as indium antimonide, gallium arsenide and indium arsenide, or from ternary or quaternary compound semiconductor thin films of (indium, gallium)-(antimony, arsenic). The so-called quantum effect elements can also be used. The compound semiconductor thin films can be formed on a variety of substrates such as an inorganic substrate like alumina or sapphire, a glass substrate like silica glass, and a semiconductor substrate like silicon and gallium arsenide.

In addition, such a method is also available that forms a thin film once on a good crystalline substrate like mica by evaporation, and transfers the thin film to the substrate via a resin. The inventors of the present invention have proposed a variety of evaporation methods of increasing the mobility of indium antimonide systems, that is, increasing the sensitivity. The thin films formed by these methods are preferably applicable to the present invention (For example, see Japanese patent application publication Nos. 1-013211 (1989), 1-015135 (1989), 2-047849 (1990) and 3-059571 (1991)).

The more sensitive Hall element has a stacked structure composed of the semiconductor thin film formed on the high-permeability magnetic substrate, followed by forming patterns of the magneto-sensitive section and internal electrodes, and by mounting a nearly rectangular high-permeability magnetic chip thereon. For example, Japanese patent application publication No. 51-045234 (1976) discloses a method of manufacturing a device of the structure from the high mobility semiconductor thin film.

More specifically, it discloses a method of forming a Hall element with the stacked structure by forming the compound semiconductor thin film on the crystalline substrate such as mica, by affixing the semiconductor thin film to the high-permeability magnetic material using an adhesive such as an epoxy resin, by removing the crystalline substrate thereafter, by forming a desired pattern, and then by placing the high-permeability magnetic chip on the magneto-sensitive section of the semiconductor thin film.

The Hall element with such a structure is preferable to construct the compact, highly sensitive magnetoelectric transducer in accordance with the present invention. As a material of the high-permeability ferromagnetic substrate and high-permeability ferromagnetic chip, high-permeability materials such as NiZn ferrite, MnZn ferrite, permalloy, and iron-silicon alloy can be used. Among them, the high-permeability ferrite is suitably applicable because it is easily cuttable and inexpensive.

To manufacture the more sensitive Hall element, the following method can be used. It forms a layer composed of silicon oxide, silicon nitride, glass, or alumina once on a mirror-finished surface of the high-permeability magnetic substrate, followed by forming a semiconductor thin film thereon by evaporation, by forming patterns of the desired magneto-sensitive section and internal electrodes, and by placing the high-permeability magnetic chip on the magneto-sensitive section.

Furthermore, as for a Hall element having low sensitivity but good temperature characteristics of the output, a method is applicable which forms the magneto-sensitive section with the Hall effect by carrying out doping into the semiconductor substrate such as a silicon substrate and gallium arsenic compound semiconductor.

A method is also possible that forms the semiconductor elements on the semiconductor substrate such as the silicon substrate, followed by forming the magneto-sensitive section by doping.

As the magnetoelectric transducers other than the Hall element, there are a ferromagnetic resistance element, a GMR, and a semiconductor magnetic resistance element, for example. As the films for the GMR and ferromagnetic resistance element, ferromagnetic materials such as Ni—Fe and Ni—Co can be used. As for the semiconductor magnetic resistance element, the above-mentioned compound semiconductor thin film can be used.

Furthermore, a method is also applicable that forms the semiconductor element section on the semiconductor substrate such as the silicon substrate, followed by forming an insulating layer, by forming the semiconductor thin film and the thin film composed of a ferromagnetic material, and by forming the electrical connection to the semiconductor element section on the substrate.

A lot of magnetoelectric transducers are produced simultaneously on the wafer through multi-stage process in general. As for the Hall element, an example of the magnetoelectric transducer in accordance with the present invention, four internal electrodes are formed simultaneously for each element in general. One of the points of the present invention is to connect the internal electrodes directly to the external electrodes without interposing any thin metal wires such as gold.

First, the semiconductor thin film is formed on the nonmagnetic substrate by the foregoing method, thereby fabricating the wafer. Then, using the photolithography and etching, a lot of internal electrodes are formed for the number of magnetoelectric transducers. As the material of the internal electrodes, one or more of the metals such as Au, Ag, Al, Cu, Pd, Cr and Ti are used. Although the internal electrodes can be composed of a single layer of the metal, they can be composed of an alloy or two or more layers of the metals. As a method of forming the internal electrode layer, plating or evaporation is available. Among them, considering the conductivity and cost, the Cu plating is preferably used.

Subsequently, it is preferable to form the distortion buffer layers at least on the magneto-sensitive sections, in which case, using photosensitive resin is convenient. For example, using a solder resist or photosensitive polyimide makes it possible to form the distortion buffer layers at high accuracy by exposure and development using an ordinary mask. It is important to form the distortion buffer layers with a uniform film thickness in a range of 1–60 µm, and preferably about 30 µm. For example, the spin coating method can be used preferably. At the instant step or the previous step, it is also possible to provide the so-called passivation layer to improve the reliability by stacking an insulator such as a metal oxide, glass or alumina at least on the magneto-sensitive sections.

To manufacture the more sensitive magnetoelectric transducer, the high-permeability magnetic material is used as the substrate, and the magneto-sensitive section and internal electrodes are formed by the foregoing method. In this case, the rectangular high-permeability magnetic chip is mounted on the magneto-sensitive section. To mount the nearly rectangular chip, the die bonding is available. As a technique of mounting the chips collectively on the entire wafer, a method disclosed in Japanese patent application publication No. 7-013987 (1995) is applicable preferably.

Subsequently, the lead frames are mounted on the internal electrodes, in which case, a method of interposing a conductive resin serving as an adhesive is available. It can be selected from a variety of conductive resins formed by scatting Cu, Ag or Pd, or their mixed metal powder, or Cu powder coated with Ag into a thermosetting resin such as an epoxy resin, polyimide resin, phenol resin, and imide denatured epoxy resin, or into a thermoplastic resin such as a phenoxy resin, polyamide resin, polystyrene, polysulfone, polyurethane resin, and polyvinyl acetate.

To form the conductive substance layer, a method is applicable such as a potting method, stamping method and screen printing. In addition, the commonly used cream soldering is also available. To form the conductive resin or cream soldering by the screen printing, it is preferable to place the approximately rectangular high-permeability magnetic chip after mounting the lead frames.

When the cream soldering is used, after applying the cream soldering to the desired locations by the screen printing using the metal mask, the lead frames can be mounted with aligning the positions, followed by establishing connection through a reflow furnace.

When placing the lead frames on the internal electrodes after mounting the approximately rectangular high-permeability magnetic chips on the magneto-sensitive sections, it is preferable to employ a method of mounting the lead frames with aligning the positions after applying the conductive resin by the stamping.

As the lead frames to be mounted on the internal electrodes, Cu-based alloys are preferable. As for the geometry of the lead frames, it has at least two thicknesses, the first thickness region and the second thickness region, and the first thickness is greater than the second thickness. The portions to become the external connecting bottom surface electrodes, which are arrayed in the patterns corresponding to the individual magnetoelectric transducers formed on the wafer, are formed so that the bottom surfaces of at least first thickness regions constitute the external connecting bottom surface electrodes of the magnetoelectric transducers, and the external connecting electrodes are connected in a lattice fashion with at least second thickness. At the final stage, the dicing is carried out along the center of the strips of the lattice using a blade with a thickness greater than the width of the strips of the lattice.

In that case, the cross sections of the lead frames with inconstant thickness ranging from at least the second thickness to the first thickness are exposed to the sides of the magnetoelectric transducer, which is one of the characteristics of the magnetoelectric transducer in accordance with the present invention. The first thickness of the lead frames can be determined in the range from 0.03 mm to 0.5 mm. It is possible to use a member coated with a metal in advance suitable for soldering at specified positions of the lead frames.

Subsequently, the protective layer is formed with facing the lead frames upward such that the thickness of the protective layer becomes equal to or less than the first thickness. The protective layer covers at least the distortion buffer layers on the magneto-sensitive section, the high-permeability magnetic chip, the sides of the lead frames and the portions of the lead frames with the second thickness. The protective layer can be selected from the thermosetting resins such as the epoxy resin, polyimide resin, imide denatured epoxy resin, or from the thermoplastic resins such as the phenoxy resin, polyamide resin, polystyrene, polysulfone, polyurethane resin, and polyvinyl acetate resin.

The protective layer can be formed by the method such as the potting, screen printing and transfer molding. In particular, the screen printing is preferably applicable which employs a metal mask or silk mask that masks the first thickness regions constituting the external connecting bottom surface electrodes, and enables the remaining regions to allow the injection of the resin. Alternatively, a method is preferably applicable which affixes a tape on the first thickness regions of the lead frames, followed by carrying out the transfer molding. Instead, a method is preferably employed which forms the protective layer resin on the entire surface by the screen printing without masking the first thickness regions of the lead frames to form the protective layer resin thinly on the first thickness regions, followed by removing the thinly formed protective layer resin by a grinder.

When using the nonmagnetic material as the substrate, unless the distortion buffer layers are formed, the magneto-sensitive sections suffer from the cure shrinkage of the resin constituting the protective layer. It will bring about, before and after the process step, large variations in the electromagnetic characteristics of the Hall element such as an input/output resistance, an unbalanced voltage and an output voltage in the presence of the magnetic field, thereby sharply reducing the yield to less than 30%. Accordingly, the distortion buffer layers are necessary to eliminate the distortion effect of the cure shrinkage of the resin on the magneto-sensitive sections. Thus, the distortion buffer layers can achieve the high yield. The distortion buffer layers are not required when the above-mentioned strong passivation layer is formed on the magneto-sensitive sections, or when the high-permeability magnetic chips are mounted thereon.

Subsequently, dicing is carried out along the center of the strips constituting the lattice with the blade with a thickness equal to or greater than the width of the strips of the lattice, which have at least the second thickness of the lead frames. Thus, the magnetoelectric transducers on the wafer are divided into pieces, and the lead frames connected through a plane are separated into elements each of which having four electrodes. At the same time, the cross sections of the lead frames are exposed to the sides of the magnetoelectric transducers with inconstant thickness ranging from the second thickness to the first thickness.

In this case, the external connecting electrodes having their bottom surfaces and side surfaces joined can be formed as illustrated in FIGS. 7 and 8 by designing such that the first thickness regions of the lead frames extend across the electrodes of the adjacent elements, and by cutting the center of the regions by the dicing.

Finally, the magnetoelectric transducers are completed by coating the lead frames at the bottom surfaces of the magnetoelectric transducers, and the cross sections of the lead frames exposed by the cutting with the metal suitable for the soldering by the barrel plating. As a method of the coating, either the electroplating or electroless plating is applicable. In addition, a method is also possible which makes a half cut in the lead frames by the dicing in advance, and plates the wafer in its entirety.

The method has an advantage of being able to carry out the plating collectively for the entire wafer because the lead frames remain connected. Afterward, the magnetoelectric transducers are completed by dicing along the above-mentioned lines with a blade with a thickness less than the blade used for the half cut. Furthermore, when only the bottom surfaces of the lead frames are coated with the metal coating, a method is applicable which forms the protective layer resin, shaves the surface of the protective layer resin by a grinder to expose the first thickness regions of the lead frames, and plates each wafer in its entirety.

The manufacturing method of the magnetoelectric transducer in accordance with the present invention has an advantage of being able to implement a magnetoelectric transducer impervious to moisture by carrying out resin molding after cutting the substrate, thereby preventing the sides of the semiconductor thin films and internal electrodes from being exposed.

More specifically, the method forms the patterns of a large number of magnetoelectric transducers on the ferrite substrate, that is, on the high-permeability magnetic substrate, first, and then places the high-permeability magnetic chips on the magneto-sensitive sections. Thus, the magneto-sensitive sections, internal electrodes and high-permeability magnetic chips constituting a lot of magnetoelectric transducers are formed on the high-permeability magnetic substrate.

Subsequently, the substrate is affixed to the tape, followed by dicing at the pitch at which the magnetoelectric transducers are formed, thereby separating the large number of magnetoelectric transducers. In this case, using a blade with a width greater than the width of the blade used for the final dicing enables forming the resin on the sides of the magnetoelectric transducers.

Subsequently, the lead frames are placed on the internal electrodes without removing the tape used for the dicing. In this case, a method of interposing the conductive resin serving as an adhesive is possible as described before.

Alternatively, a method is also possible which establishes electrical connection by placing on the internal electrodes solder balls with a size best suited to the size of the internal electrodes in advance, or by applying an appropriate amount of solder paste on the internal electrodes by printing using a metal mask, followed by placing the lead frames with aligning the positions, and by establishing electrical connection by melting the solder through heating process by reflow or the like.

Finally, the dicing is carried out along the center of the strips of the lattice using the blade with a thickness greater than that of the strips of the lattice. In this case, the cross sections of the lead frames with inconstant thickness ranging from at least the second thickness to the first thickness are exposed to the sides of the magnetoelectric transducers, which is one of the characteristics of the magnetoelectric transducer in accordance with the present invention. The first thickness of the lead frames ranges from 0.05 mm to 0.4 mm, and preferably from 0.1 mm to 0.2 mm. Specified places of the lead frames may be coated with a metal film suitable for the soldering.

Subsequently, after electrically connecting the internal electrodes to the lead frames, the tape used for the dicing is removed. The tape serves to keep the array until the diced magnetoelectric transducers are electrically connected to the lead frames.

The following method is available to maintain the array of the magnetoelectric transducers other than the method of using the dicing tape. The method takes the following steps to manufacture a more sensitive magnetoelectric transducer. First, a stack structure is formed by mounting approximately rectangular high-permeability magnetic chips on the magneto-sensitive sections. Second, the substrate is affixed to the tape, followed by dicing at the pitch at which the magnetoelectric transducers are formed, thereby separating the large number of magnetoelectric transducers. Third, after removing the magnetoelectric transducers from the tape, the separated magnetoelectric transducers are fitted to a lot of cavities formed in a tray plate composed of stainless steal or carbon by etching or cutting so that they are finally aligned with their rectangular high-permeability magnetic chips on the magneto-sensitive sections facing upward by vibrating and oscillating them and by utilizing the characteristics of the stack structure. Then, the magnetoelectric transducers are fixed by suction from the bottom of the cavities, thereby maintaining the array of the magnetoelectric transducers.

Subsequently, after mounting the lead frames by the foregoing method, the suction is released once, and the internal electrodes of the magnetoelectric transducers are connected to desired positions of the lead frames collectively. Thus, the method is characterized by aligning the magnetoelectric transducers using the tape or tray plate to fit them collectively to the lead frames, and by connecting the internal electrodes of the magnetoelectric transducers to the lead frames.

Subsequently, the heat-resistant tape is affixed to the surface of the lead frames. As the heat-resistant tape, a self-adhering tape is preferably used which is composed of a polyimide base and a silicone-based self-adhesive applied to the base. Alternatively, a method can be employed which affixes the heat-resistant tape to the surface of the lead frames in advance, and electrically connects the internal electrodes to the lead frames.

After facing the surface upward of the substrate opposite to the lead frames, the protective layer is formed. The resin for the protective layer is injected through the surface or sides of the substrate so that the resin flows through the grooves with the thickness of the blade of the dicing, or between the individual substrates of the magnetoelectric transducers formed at the spacings of the cavities in the tray plate. Thus, the protective layer resin covers at least the conductive resin that electrically connects the internal electrodes to the lead frames, or the magneto-sensitive sections, internal electrodes and lead frames formed on the sides of the metal and the surface of the substrate.

As the protective layer, the above-mentioned protective layer can be used. It can be formed by the potting, screen printing, and transfer molding, among which the transfer molding or screen printing using the metal mask in a vacuum is preferably used. After forming the protective layer in this way, the heat-resistant tape is removed.

Subsequently, the dicing is carried out along the center of the strips of the lattice using the blade with a thickness greater than that of the strips of the lattice having at least the second thickness of the lead frames. In this case, the magnetoelectric transducers on the wafer are divided into pieces, and the lead frames joined in one plane are simultaneously divided into elements, each of which has four electrodes. In addition, the cross sections of the lead frames with inconstant thickness ranging from the second thickness to the first thickness are exposed to the sides of the magnetoelectric transducers. Furthermore, designing the lead frames such that the first thickness regions of the lead frames extend across the electrodes of the adjacent elements, and dicing the center of these sections make it possible to form the external connecting electrodes, in which the bottom surfaces are connected to the side surfaces as shown in FIGS. 15 and 20.

Finally, the magnetoelectric transducers are completed by plating the bottom surfaces of the lead frames and the cross sections of the lead frames exposed by the dicing of the magnetoelectric transducers with a metal suitable for the soldering by the barrel plating. The coating can be achieved by either the electroplating or electroless plating.

A method is also applicable which carries out the half cut of the lead frames by the dicing in advance, followed by plating the wafer in its entirety. This method is advantageous because the lead frames remain connected, and hence the plating can be carried out for the entire wafer at a time. Afterward, the magnetoelectric transducers with the external connecting electrodes as shown in FIGS. 17 and 22 are completed by dicing along the above-mentioned lines with the blade whose thickness is less than that of the blade used for the half cut.

In this case, when the metal coating is applied only to the bottom surfaces of the lead frames as shown in FIGS. 16 and 21, a method is also applicable which plates the lead frames in advance, affixes the heat-resistant tape, and forms the protective layer, or which removes the heat-resistant tape, and then plates the wafer in its entirety.

The following method is also possible. First, the method designs the lead frames by changing the patterns of the lead frames such that the regions that have the first thickness and finally constitute the electrically connecting terminals to the outside are aligned on a line as shown in FIG. 30. Second, the method connects the lead frames to the internal electrodes as shown in FIG. 29, followed by forming the protective layer by the foregoing method, and by the dicing along the center of the strips of the lattice using the blade with a thickness greater than that of the strips of the lattice having the thickness greater than the second thickness.

In this case, the magnetoelectric transducers on the wafer are divided into pieces, and the lead frames joined in a plane are also separated to the elements, each of which has four electrodes. The electrodes are aligned on a side of a surface of each approximately rectangular magnetoelectric transducer. In addition, as for the cross sections of the lead frames, which are exposed with inconstant thickness ranging from the second thickness to the first thickness of the lead frames, they are exposed on the diced cross sections constituting another plane abutting the above-mentioned side.

When using the diced cross section as the mounting surface, the cross sections of the lead frames exposed by the dicing become the external connecting terminals that come into contact with the mounting substrate, and the first thickness lead frame regions for the external connection, which are aligned and exposed to the side of the surface on which the heat-resistant tape is affixed, become the side electrodes on which the solder fillets are formed in the mounting. Finally, after applying the barrel plating, the vertical magnetoelectric transducers with the external connecting electrodes as shown in FIGS. 18 and 23 are completed.

Moreover, as for the first thickness lead frame regions that are aligned on the side in advance and constitute the external connecting terminals, the following geometry is possible. Specifically, the half cut is made in only the direction they are aligned before cutting into pieces, thereby implementing the geometry of the external connecting terminals aligned, which has one side of each of them cut off. The geometry is effective to increase the mounting strength. The vertical magnetoelectric transducers with the external connecting electrodes as shown in FIGS. 19 and 24 are completed by applying the final barrel plating.

The present invention is characterized by being able to manufacture the elements very simply by processing the entire wafer collectively.

As described above, the magnetoelectric transducer in accordance with the present invention, which employs at least the bottom surfaces of the lead frames and the cross sections of the lead frames exposed to the sides as the connecting terminals to the external electrodes, can determine the quality of the mounting of the element on the substrate by inspecting the element nondestructively as to whether the solder leaks to the sides or not, for example, with an optical device such as a microscope.

In addition, the present invention can provide the magnetoelectric transducer capable of detecting the magnetic flux density different in direction by 90° with respect to the mounting surface by aligning, on the one side of the approximately rectangular body, the electrical connecting terminals to the outside, and by using the cut cross section as the mounting surface.

BEST MODE FOR CARRYING OUT THE INVENTION

The best mode for carrying out the invention will now be described with reference to the accompanying drawings.

Figure 1:
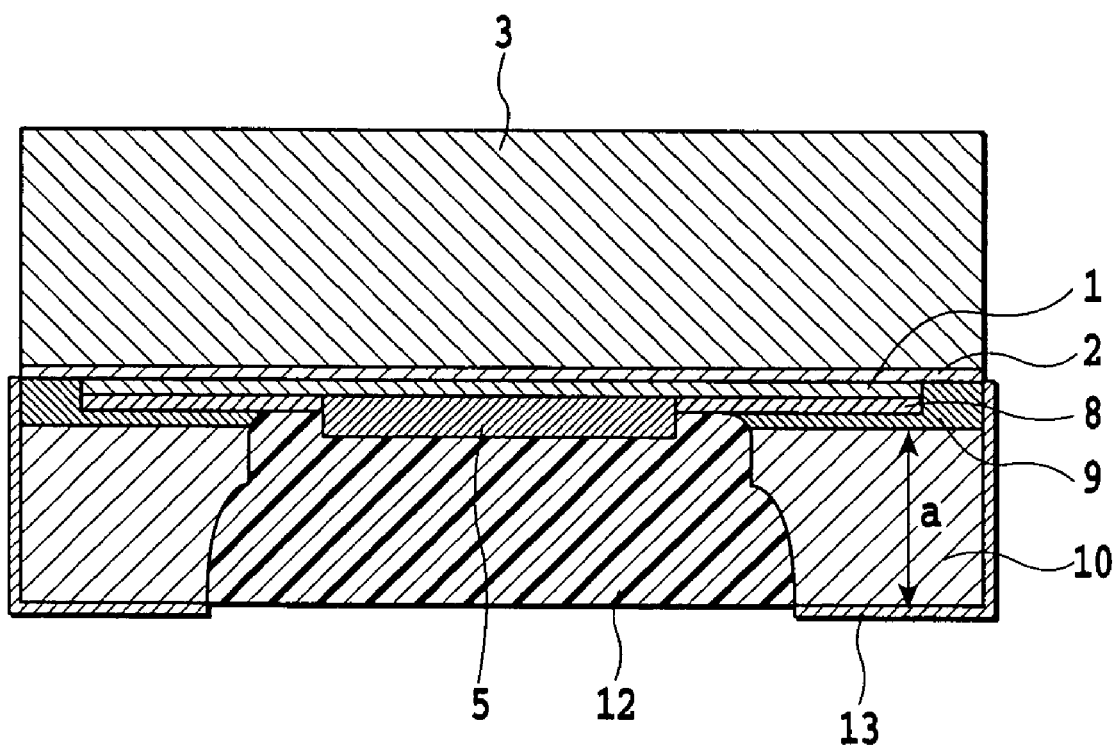
FIGS. 1–3 are each a schematic cross-sectional view illustrating a first embodiment of the Hall element in accordance with the present invention.
Figure 2:
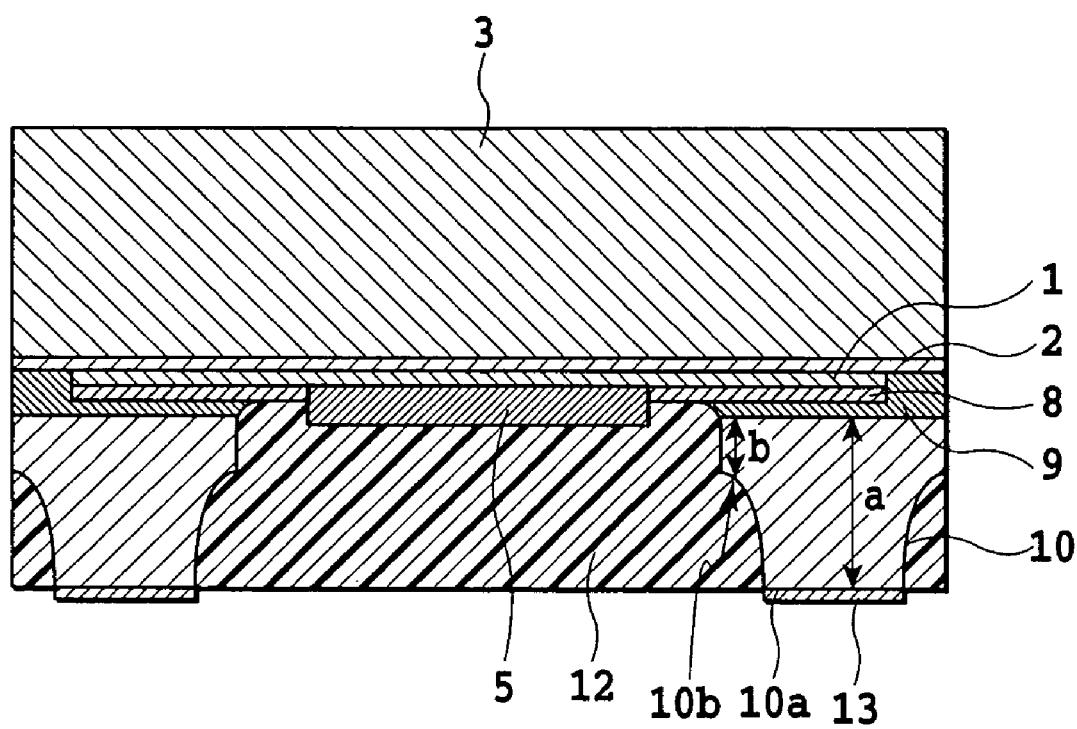
Figure 3:
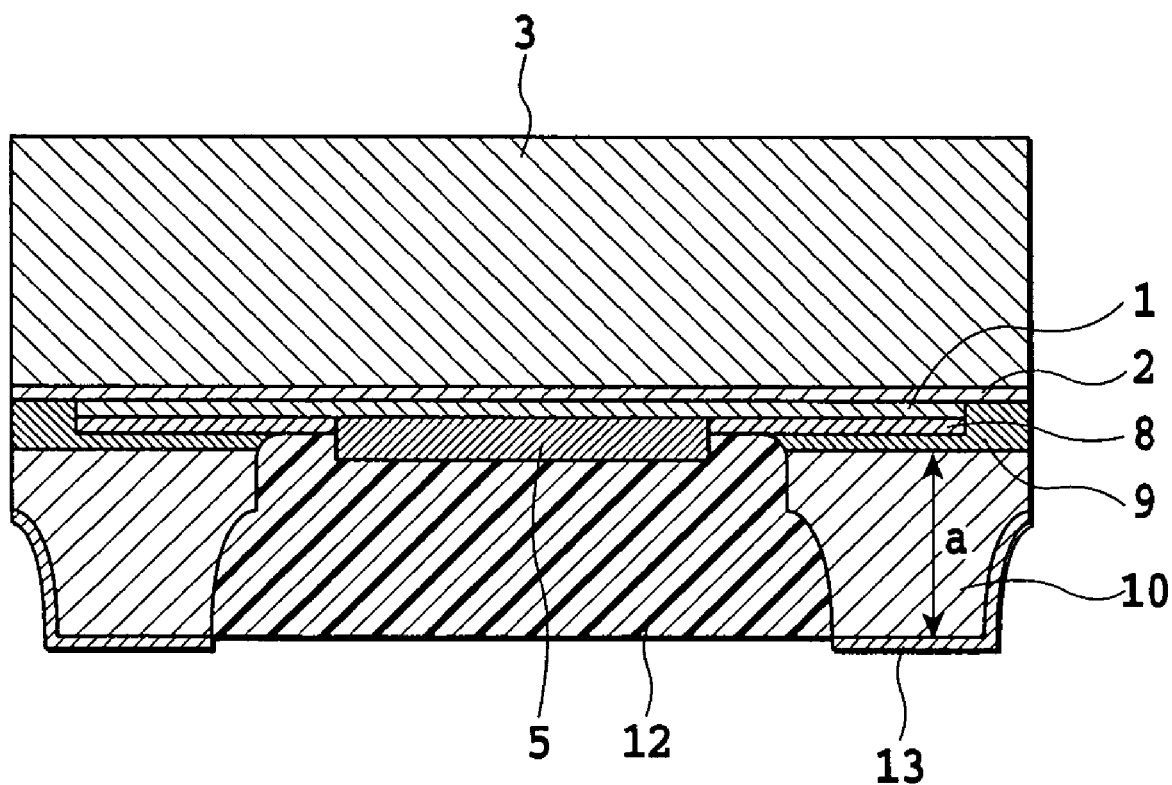

FIGS. 1–3 are each a schematic cross-sectional view illustrating a first embodiment of the Hall element, one of the magnetoelectric transducer in accordance with the present invention. FIG. 1 shows an example in which its substrate consists of a nonmagnetic substrate, and its leads constitute bottom surface connecting electrodes with a first thickness, and side electrodes with the first thickness that are exposed by cutting. FIG. 2 shows an example in which its substrate consists of a nonmagnetic substrate, and the cross sections of the leads exposed to the sides have inconstant thickness in a range at least from the first thickness to a second thickness. FIG. 3 shows an example in which its substrate consists of a nonmagnetic substrate, and the cross sections of the leads exposed to the sides have the first thickness with a step height.

In these figures, the reference 1 designates a magneto-sensitive section, 2 designates a resin layer or an inorganic layer, 3 designates a substrate (nonmagnetic substrate), 5 designates a distortion buffer layer covering the magneto-sensitive section 1, 8 designates an internal electrode composed of a metal, 9 designates a conductive substance (conductive resin layer or a metal layer) formed on the internal electrodes 8 for electrically connecting leads 10 with the internal electrodes 8, 12 designates a protective resin layer, and 13 designates a metal coating constituting external electrodes of the leads 10.

The magnetoelectric transducer in accordance with the present invention comprises the substrate 3 on which the magneto-sensitive section 1 and the internal electrodes 8 are disposed; the leads 10 which are mounted on the internal electrodes 8 and include at least two regions—a region 10a with a first thickness (a) and a region 10b with a second thickness (b), where the first thickness is greater than the second thickness; the resin 12 for sealing the magneto-sensitive section 1 formed on the substrate 3, the internal electrodes 8 and part of the leads 10; and the external connecting terminals (side electrodes) 13 provided on the exposed surfaces of the first thickness region 10a of the leads 10.

Figure 14:
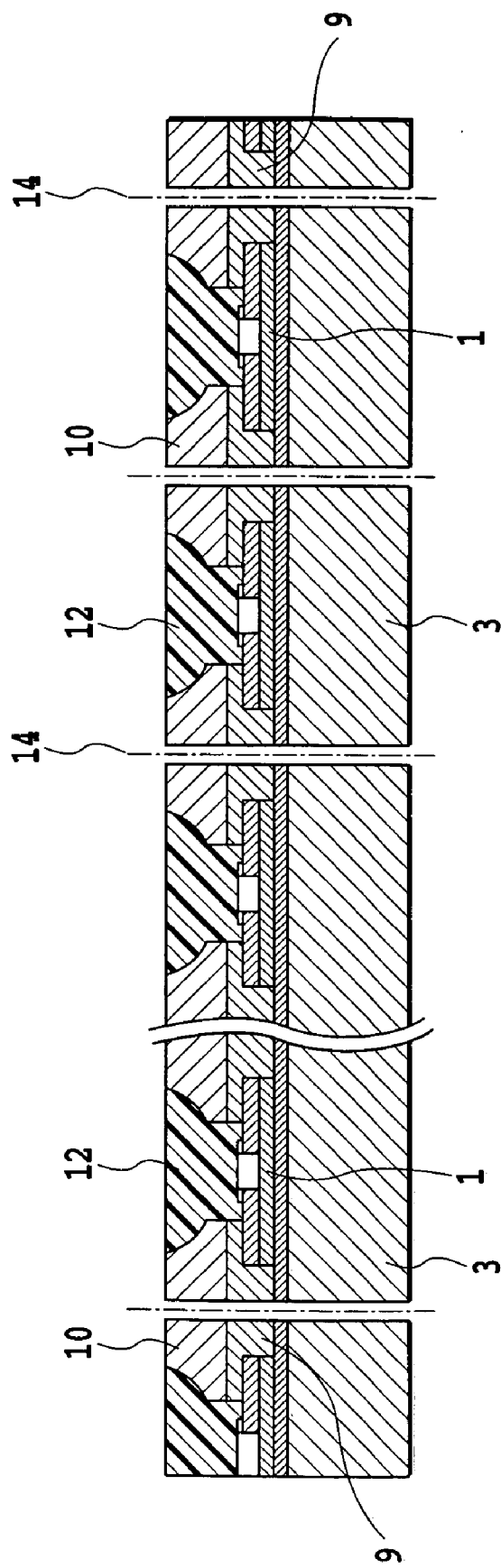

In FIG. 1, the side electrodes 13 with the first thickness are formed as follows. The bottom surface connecting electrodes with the first thickness in the leads 10 are extended across the internal electrodes 8 of the adjacent magnetoelectric transducers with maintaining the first thickness. The side of the leads 10 with the first thickness is formed by cutting the center thereof (cutting lines 14 as shown in FIG. 14).

In FIG. 2, the side of the leads 10 with the thickness less than the first thickness is formed as follows. The leads 10 with the second thickness less than the first thickness are formed across the internal electrodes 8 of the adjacent magnetoelectric transducers. After forming an epoxy resin, their center is cut to form the sides of the leads 10 with the thickness less than the first thickness.

In FIG. 3, after forming the epoxy resin in the state of FIG. 1, the sides of the leads 10 are formed by carrying out half cut, followed by cutting the center by a blade thinner than the half cut.

Figure 4:
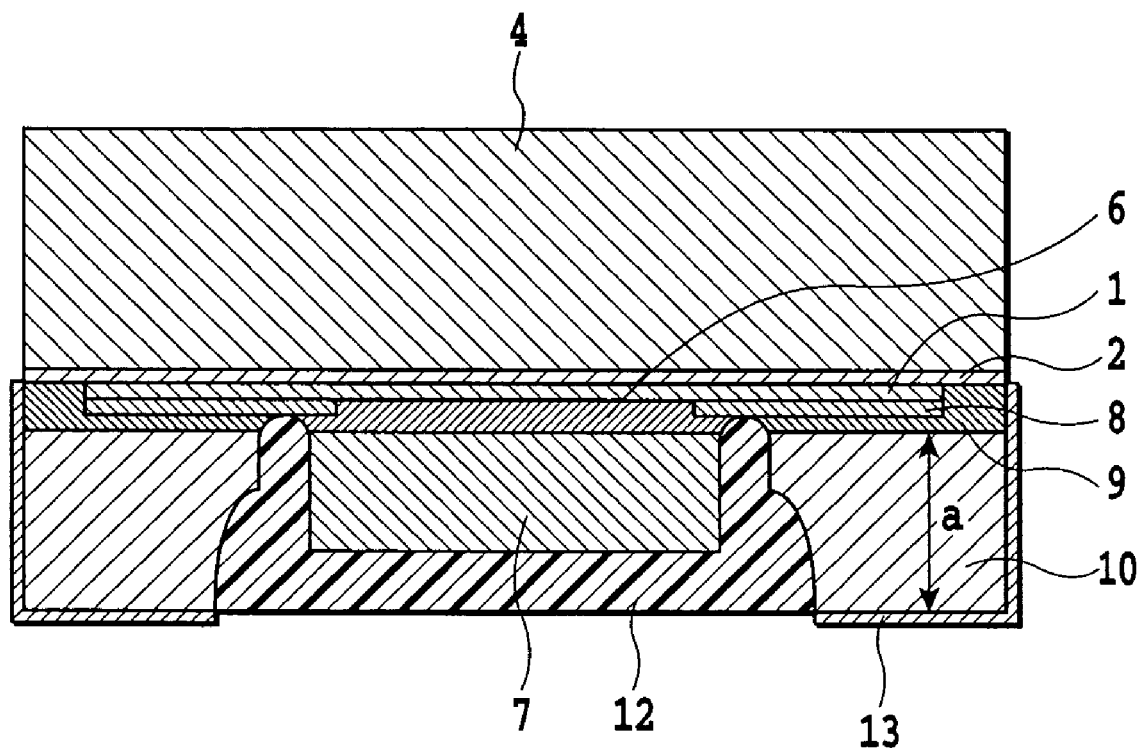
FIGS. 4–6 are each a schematic cross-sectional view illustrating a variation of the first embodiment of the Hall element in accordance with the present invention.
Figure 5:
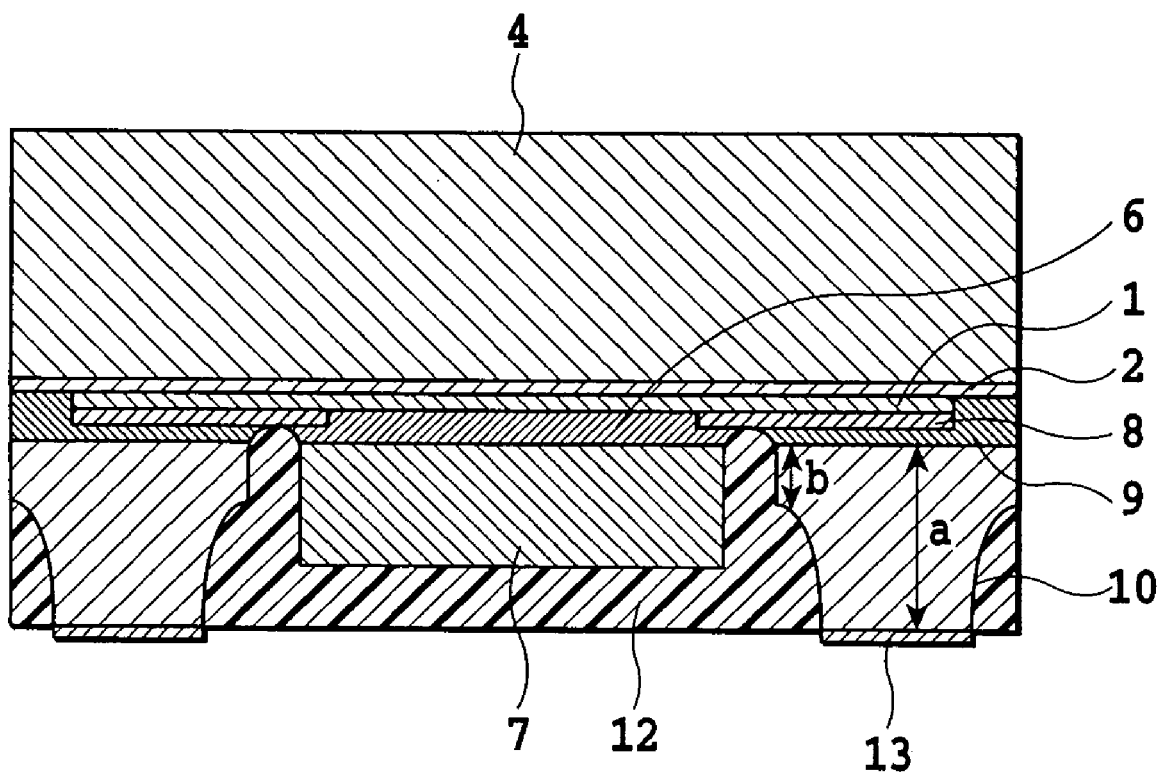
Figure 6:
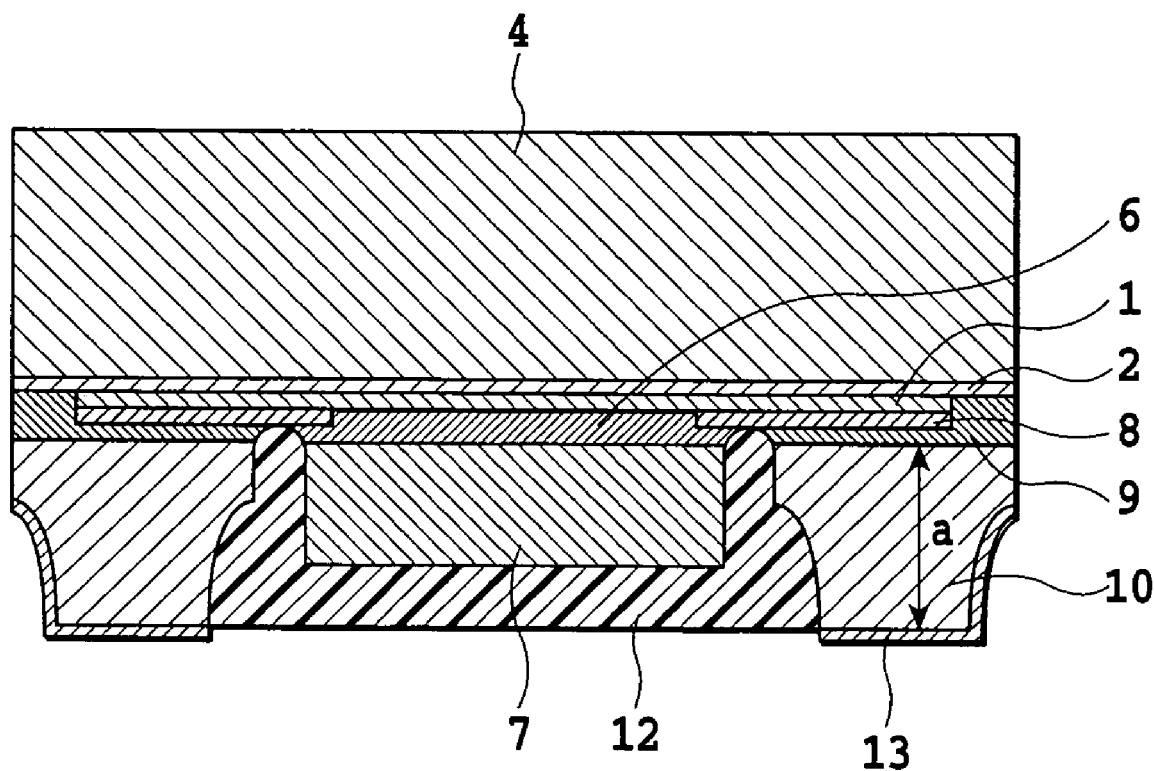

FIGS. 4–6 are each a schematic cross-sectional view illustrating a variation of the first embodiment of the Hall element, one of the magnetoelectric transducer in accordance with the present invention. FIG. 4 shows a more sensitive Hall element in which its substrate consists of a high-permeability magnetic substrate, and its leads constitute bottom surface connecting electrodes with the first thickness, and the side electrodes with the first thickness that are exposed by cutting. FIG. 5 shows an example in which its substrate consists of a high-permeability magnetic substrate, and the cross sections of the leads exposed to the sides have inconstant thickness in a range at least from the first thickness to the second thickness. FIG. 6 shows an example in which its substrate consists of a high-permeability magnetic substrate, and the cross sections of the leads exposed to the sides have the first thickness with a step height.

In these figures, the reference numeral 4 designates a substrate (high-permeability magnetic material); 6 designates a resin layer for joining a high-permeability magnetic chip 7 onto the magneto-sensitive section 1; and 7 designates the high-permeability magnetic chip with a rectangular shape. The components with the same functions as those shown in FIGS. 1–3 are designated by the same reference numerals, and FIGS. 4–6 correspond to FIGS. 1–3, respectively.

Figure 7:
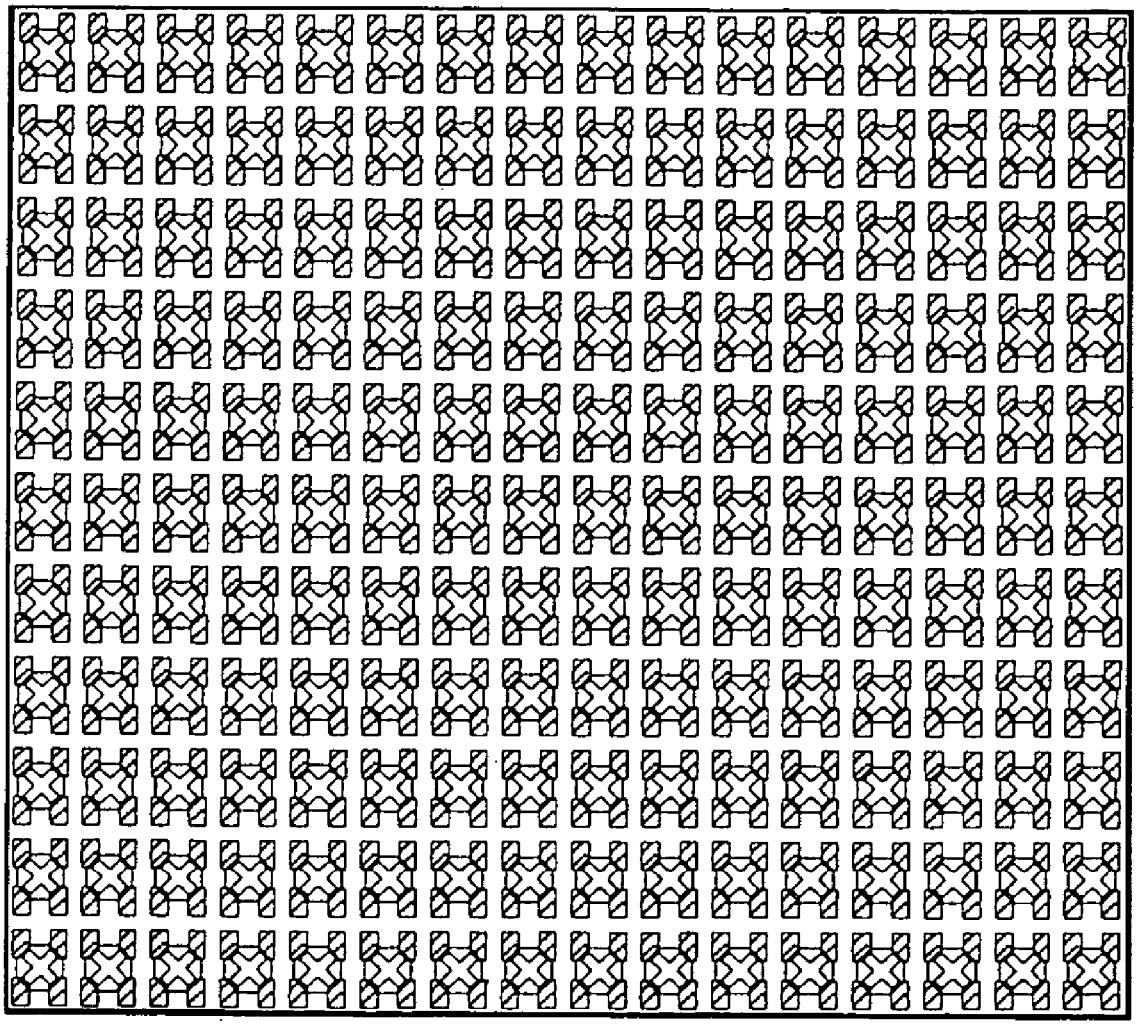
FIGS. 7–14 are each a process diagram illustrating a manufacturing method of the first embodiment as shown in FIGS. 1–6.
Figure 8:
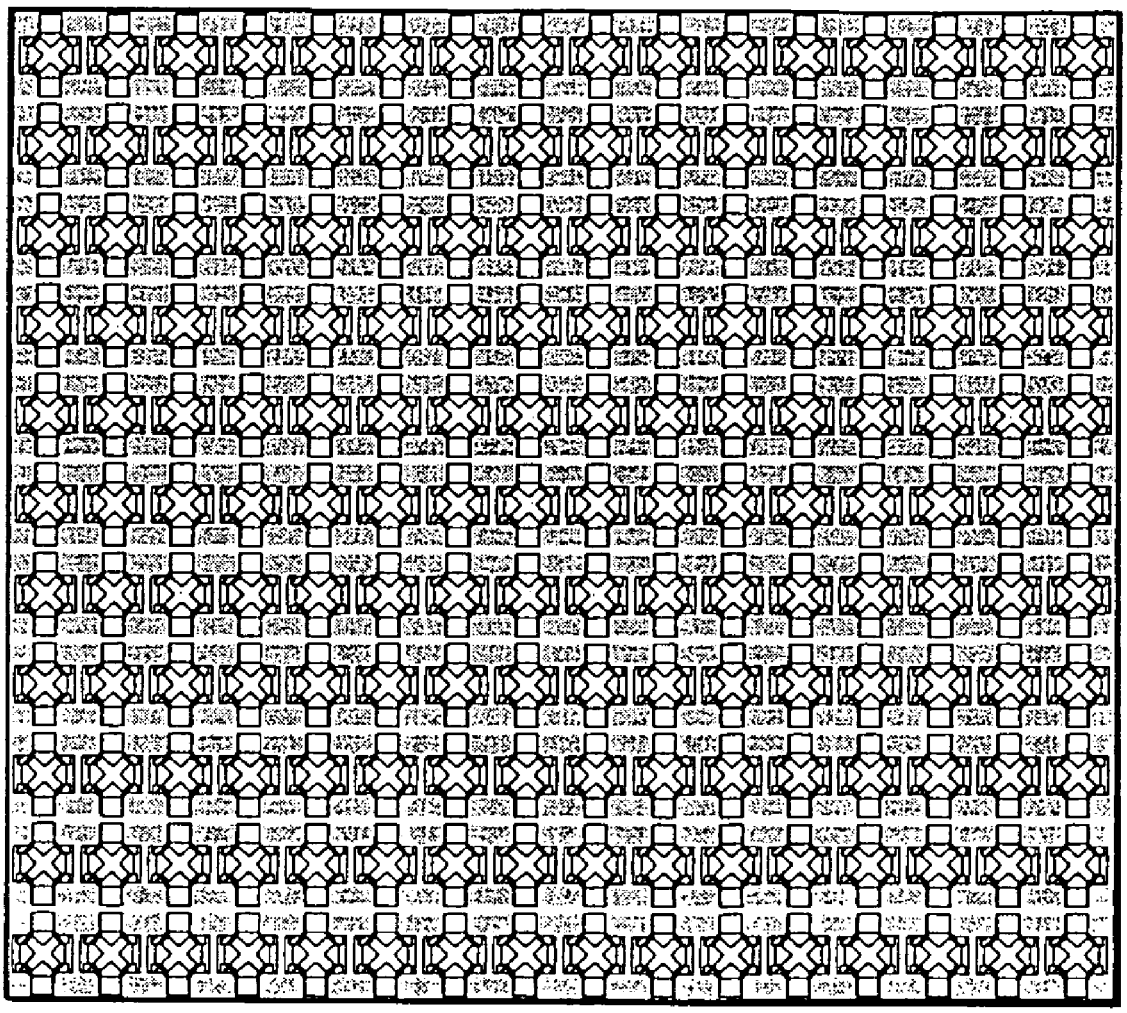
Figure 9:
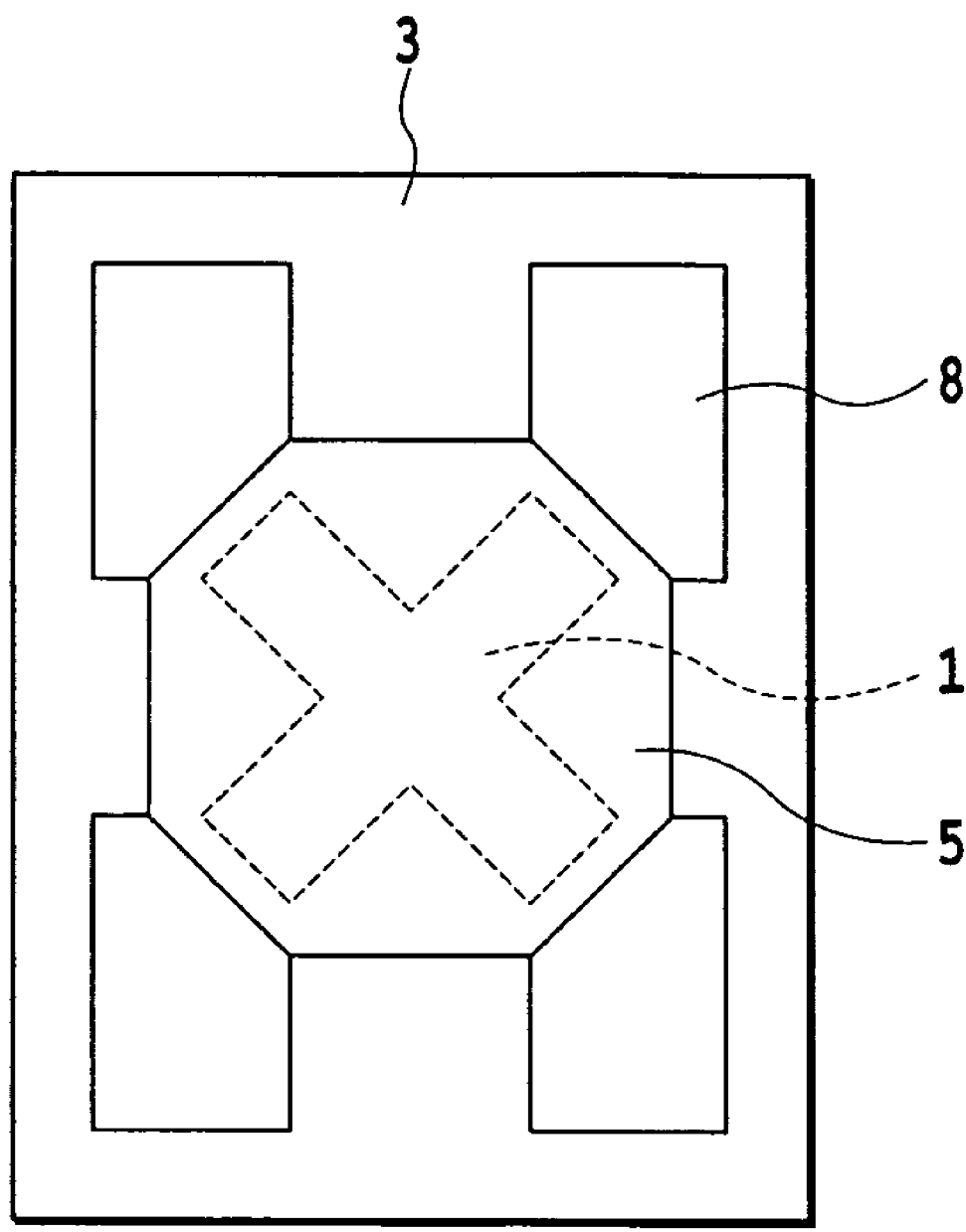
Figure 10:
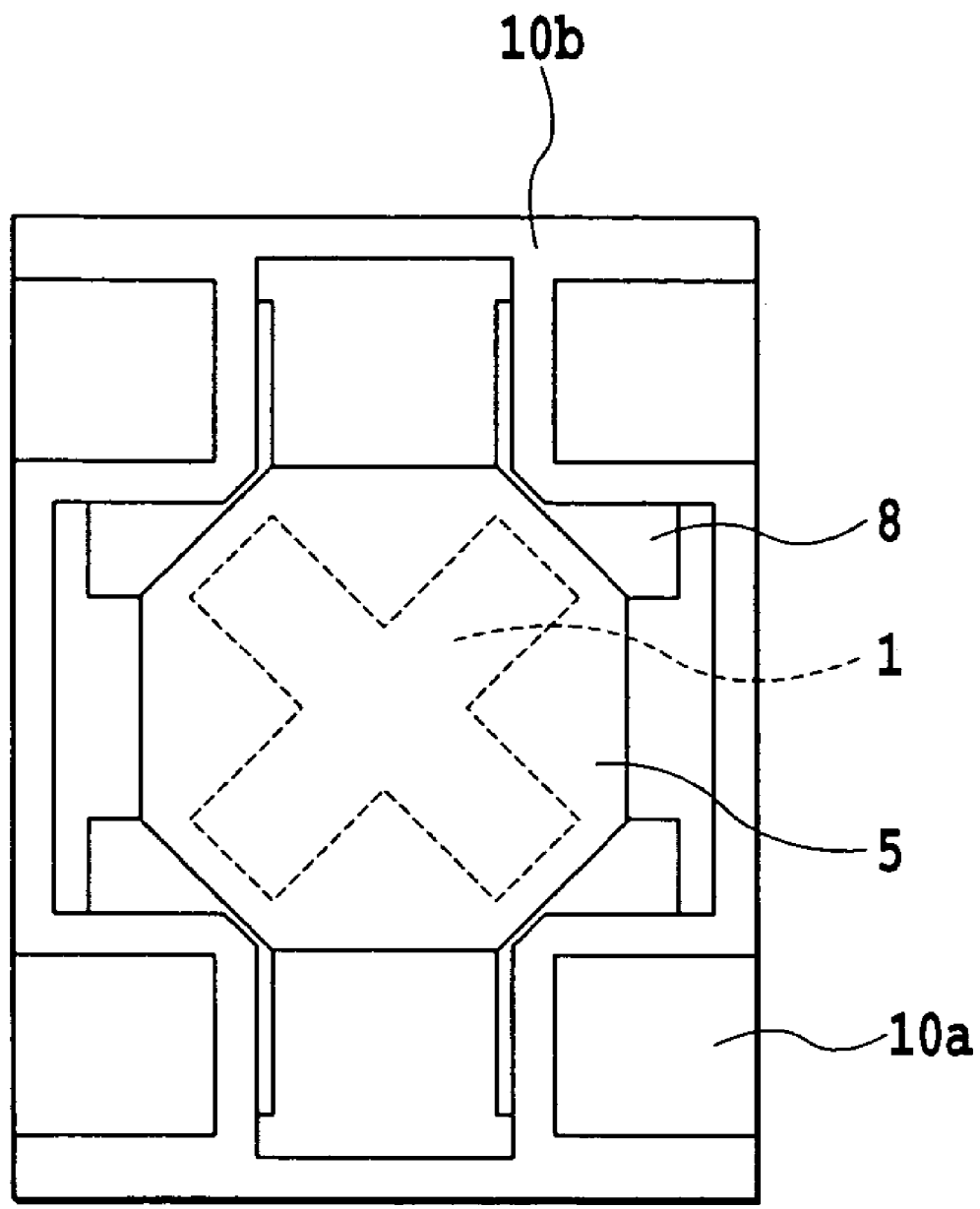

Process steps of fabricating the Hall elements as shown in FIGS. 1–6 will now be described with reference to FIGS. 7–14. FIG. 7 shows the nonmagnetic substrate, that is, the alumina substrate 3, on which patterns of a large number of magnetoelectric transducers are formed. FIG. 8 is a view showing the internal electrodes 8, magneto-sensitive sections 1, distortion buffer layers 5 and positional relationships between the patterns of first thickness regions of the leads having the two thicknesses and the internal electrodes of the individual magnetoelectric transducers. FIGS. 9 and 10 are partially enlarged views of FIGS. 7 and 8, respectively. The wafer as shown in FIGS. 7–10 was fabricated through the following process steps.

EXAMPLE 1

First, a cleavage mica was used as an evaporation substrate, and an In-excess InSb thin film was formed by evaporation. Subsequently, using a method of evaporating excess Sb that forms a compound with the excess In in the InSb film, an InSb thin film of 0.7 µm thickness with the electron mobility of 46000 $cm^2$/V/sec was formed.

Subsequently, a 54 mm square, 0.2 mm thick alumina substrate 3 was prepared, and polyimide resin was dropped on the InSb thin film, on which the alumina substrate 3 was overlaid, followed by placing a heavy weight thereon and being left for 12 hours at 200° C. Subsequently, it was placed in the room temperature, deprived of the mica, thereby forming a wafer having the InSb thin film formed on the surface.

Subsequently, Hall element patterns were formed on the wafer by photolithography. Then, patterning of the internal electrodes was carried out, and electroless copper plating followed by electro-copper plating for thickening was made.

Subsequently, after forming an etching pattern, etching was carried out to form the magneto-sensitive sections 1 and the internal electrodes 8. Each magneto-sensitive section 1 was 350 µm long and 170 µm wide. Each pellet of the Hall element was a 0.6 mm×0.9 mm square.

Figure 11:
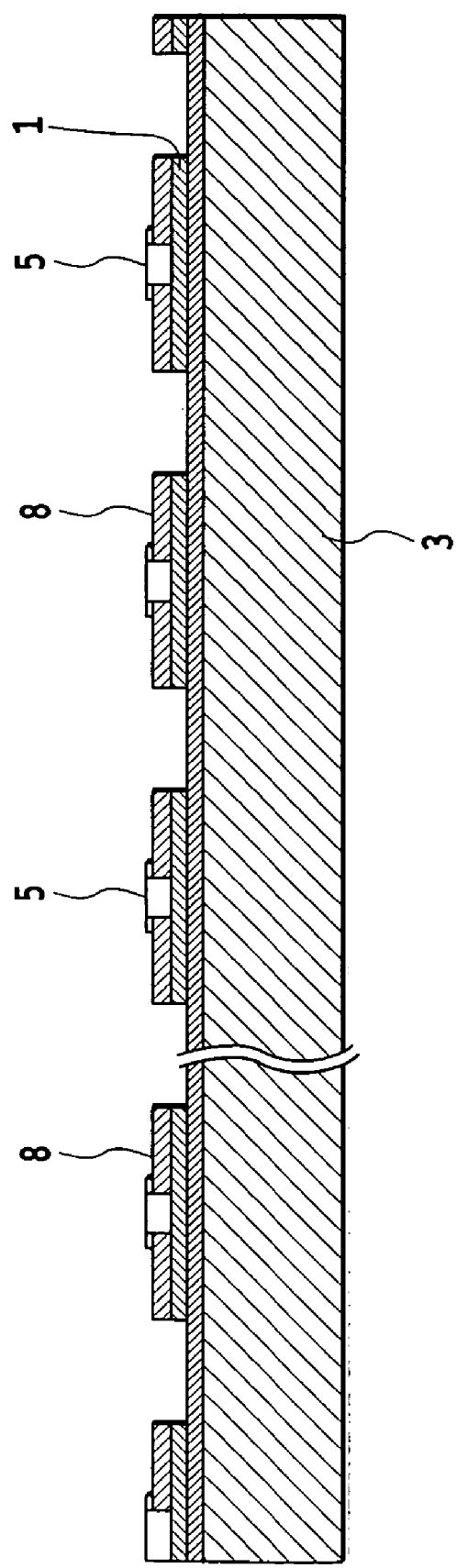

Subsequently, to form solder resist (distortion buffer layers 5) on the magneto-sensitive sections 1, the solder resist was applied to the thickness of 30 µm using a spin coater, and was formed only on specified portions by the photolithography process. This state is shown in FIG. 11.

Figure 12:
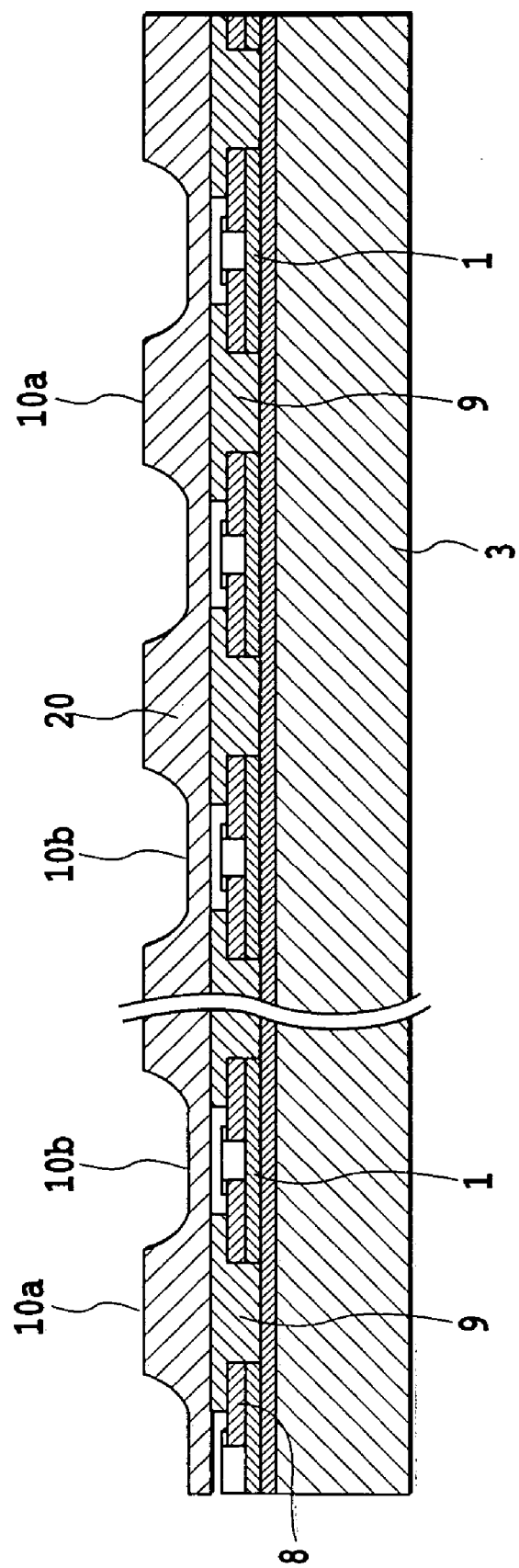

Subsequently, as shown in FIG. 12, a coating of a 20 µm thick conductive resin employing Ag as a filler was applied across the internal electrodes of the adjacent magnetoelectric transducers by the screen printing. After that, a set of lead frames 20 having two thicknesses, the first thickness of which is 0.1 mm, was mounted thereon with aligning the patterns of the lead frames 20 to the patterns of the internal electrodes of the Hall elements on the wafer, followed by hardening the thermosetting conductive resin and by electrically connecting the internal electrodes 8 to the lead frames 20.

Figure 13:
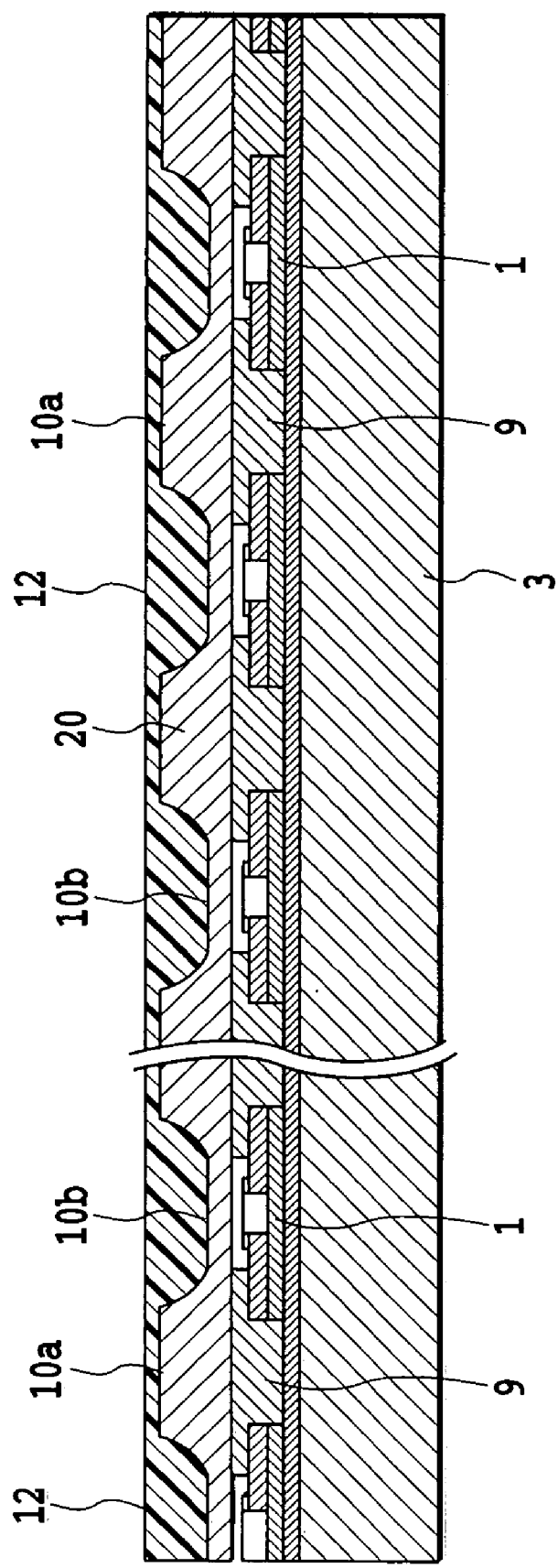

Subsequently, as shown in FIG. 13, an epoxy resin was applied onto the set of lead frames 20 by the screen printing, and was set by heating. In this case, the epoxy resin was formed not only on the distortion buffer layers and lead frames on the magneto-sensitive section, but also thinly on the lead frames with the first thickness.

Subsequently, as shown in FIG. 14, the epoxy resin on the top surface was shaved with a grinder, thereby exposing the first thickness regions 10a of the lead frames.

Subsequently, along cutting lines 14 as shown in FIG. 14, the wafer was cut in XY directions using a 0.2 mm wide blade, thereby being separated into individual Hall elements.

Finally, barrel plating was applied to the bottom surfaces of the lead frames, to the cross sections of the lead frames on the sides of the Hall elements exposed by the cutting with the dicing saw, and to the cross sections of the conductive resin, thereby forming 3 µm thick Ni plating, followed by applying 2 µm thick solder plating on the foregoing metal.

Each Hall element thus formed has the cross section as shown in FIG. 1. The present example of the Hall element has a size of 0.6×0.9 mm square by 0.3 mm thickness. The sensitivity of the Hall element was on average about 110 mV for the input voltage of 1 V in the magnetic flux density of 0.05 T.

EXAMPLE 2

The alumina substrate bearing the semiconductor thin films was fabricated as follows. A 3000 angstrom $Al_2O_3$ was formed on the mirror-finished surface of a 54 mm square, 0.2 mm thick alumina substrate 3. Then, an InSb thin film with the electron mobility of 14000 $cm^2$/V/sec was formed by the evaporation as in the example 1.

Subsequently, Hall element patterns were formed on the wafer by the photolithography. After patterning the internal electrodes and magneto-sensitive sections, the pattern formation was carried out by etching, followed by evaporation of Ni and Cr by the liftoff evaporation to form the internal electrodes. Each magneto-sensitive section 1 was 350 µm long and 170 µm wide. The pellet of each Hall element was a 0.6 mm×0.9 mm square. Subsequently, by the masked evaporation, a 3000 angstrom $Al_2O_3$ was formed on the surface in which the magneto-sensitive sections were formed.

Afterward, the solder resist (distortion buffer layers 5) was formed as in the example 1. Specifically, the solder resist was applied to the thickness of 30 µm using the spin coater, and was formed only on the specified portions by the photolithography. From then on, the magnetoelectric transducers were fabricated as in the example 1.

Each Hall element thus formed has the cross section as shown in FIG. 1. The present example of the Hall element has a size of 0.6×0.9 mm square by 0.3 mm thickness. The sensitivity of the Hall element was about 32 mV on the average for the input voltage of 1 V in the magnetic flux density of 0.05 T.

EXAMPLE 3

The wafer as shown in FIG. 11 was manufactured for the purpose of implementing more sensitive Hall elements through the following process steps.

First, a cleavage mica was used as an evaporation substrate, and an In-excess InSb thin film was formed by evaporation. Subsequently, using a method of evaporating excess Sb that forms a compound with the excess In in the InSb film, an InSb thin film of 0.7 µm thickness with the electron mobility of 46000 cm$^2$/V/sec was formed. Subsequently, a 54 mm square, 0.25 mm thick NiZn ferrite substrate 4 was prepared, and polyimide resin was dropped on the InSb thin film, on which the NiZn ferrite substrate 4 was overlaid, followed by placing a heavy weight thereon and being left for 12 hours at 200° C.

Subsequently, it was placed in the room temperature, deprived of the mica, thereby forming a wafer having the InSb thin film formed on the surface. Subsequently, Hall element patterns were formed on the wafer by photolithography. Then, patterning of the internal electrodes was carried out, and electroless copper plating followed by electro-copper plating for thickening was made. Subsequently, after forming an etching pattern, etching was carried out to form the magneto-sensitive sections 1 and the internal electrodes 8. Each magneto-sensitive section 1 was 350 µm long and 170 µm wide. Each pellet of the Hall element was a 0.6 mm×0.9 mm square.

Subsequently, according to a method described in Japanese patent application publication No. 7-013987(1995), a 0.3 mm square, 0.12 mm thick, rectangular MnZn ferrite chips were mounted on the surfaces of the magneto-sensitive sections 1 of the semiconductor devices using a silicone resin as an adhesive.

Subsequently, a coating of a 20 µm thick conductive resin employing Ag as a filler was applied across the internal electrodes of the adjacent magnetoelectric transducers by the stamping method. After that, the lead frames having two thicknesses, the first thickness of which was 0.15 mm, was mounted thereon with aligning the patterns of the lead frames to the patterns of the internal electrodes of the Hall elements on the wafer, followed by hardening the thermosetting conductive resin and by electrically connecting the internal electrodes to the lead frames. From then on, the Hall elements were fabricated as in the example 1.

Each Hall element thus formed has the cross section as shown in FIG. 4. The present example of the Hall element has a size of 0.6×0.9 mm square by 0.4 mm in thickness. The sensitivity of the Hall element was on average about 250 mV for the input voltage of 1 V in the magnetic flux density of 0.05 T.

EXAMPLE 4

The high-permeability magnetic substrate bearing the semiconductor thin films was fabricated as follows. A 3000 angstrom SiO$_2$ was formed on the mirror-finished surface of a 54 mm square, 0.25 mm thick NiZn ferrite substrate. Then, an InSb thin film with the electron mobility of 14000 cm$^2$/V/sec was formed thereon by the evaporation as in the example 1.

Subsequently, the Hall element patterns were formed on the wafer by the photolithography. After patterning the internal electrodes and magneto-sensitive sections, the pattern formation was carried out by etching, followed by evaporation of Ni and Cr by the liftoff evaporation to form the internal electrodes 8. Each magneto-sensitive section 1 was 350 µm long and 140 µm wide. The pellet of each Hall element was a 0.6 mm×0.9 mm square.

Subsequently, according to the method described in Japanese patent application publication No. 7-013987(1995), a 0.3 mm square, 0.12 mm thick, rectangular MnZn ferrite chips were mounted on the surface of the magneto-sensitive sections 1 of the semiconductor device using a silicone resin as an adhesive.

Subsequently, a coating of a 20 µm thick conductive resin employing Ag as a filler was applied across the internal electrodes of the adjacent magnetoelectric transducers by the stamping method. After that, the lead frames having two thicknesses, the first thickness of which was 0.15 mm, was mounted thereon with aligning the patterns of the lead frames to the patterns of the internal electrodes of the magnetoelectric transducers on the wafer, followed by hardening the thermosetting conductive resin and by electrically connecting the internal electrodes to the lead frames. From then on, the Hall elements were fabricated as in the example 1.

Each Hall element thus formed has the cross section as shown in FIG. 4. The present example of the Hall element has a size of 0.6×0.9 mm square by about 0.4 mm thickness. The sensitivity of the Hall element was on average about 98 mV for the input voltage of 1 V in the magnetic flux density of 0.05 T.

Although the foregoing examples are described by way of example of the Hall element, it is obvious that the concept and manufacturing method of the present invention are applicable to other magnetoelectric transducers such as semiconductor MRs and ferromagnetic MRs and GMRs.

FIGS. 15–24 are each a schematic cross-sectional view illustrating a second embodiment of the Hall element, one of the magnetoelectric transducer in accordance with the present invention. FIGS. 15–19 show cases using as the substrate one of a high-permeability magnetic substrate, inorganic substrate, glass substrate, semiconductor substrate, and semiconductor substrate on which the semiconductor elements are formed. FIGS. 20–24 showcases using a high-permeability magnetic substrate as the substrate, and has a high-permeability magnetic chip on the magneto-sensitive section.

The second embodiment is characterized in that the sides, at which the magneto-sensitive section 1 is electrically connected to the internal electrodes 8 and the leads 10, are sealed by the resin 12. Although examples of the Hall element, one of the magnetoelectric transducer in accordance with the present invention, will be described with reference to the drawings, the present invention is not limited to the example.

In these figures, the components with the same functions as those of FIGS. 1–6 are designated by the same reference numerals, and FIGS. 15–19 correspond to FIGS. 20–24, respectively.

Figure 15:
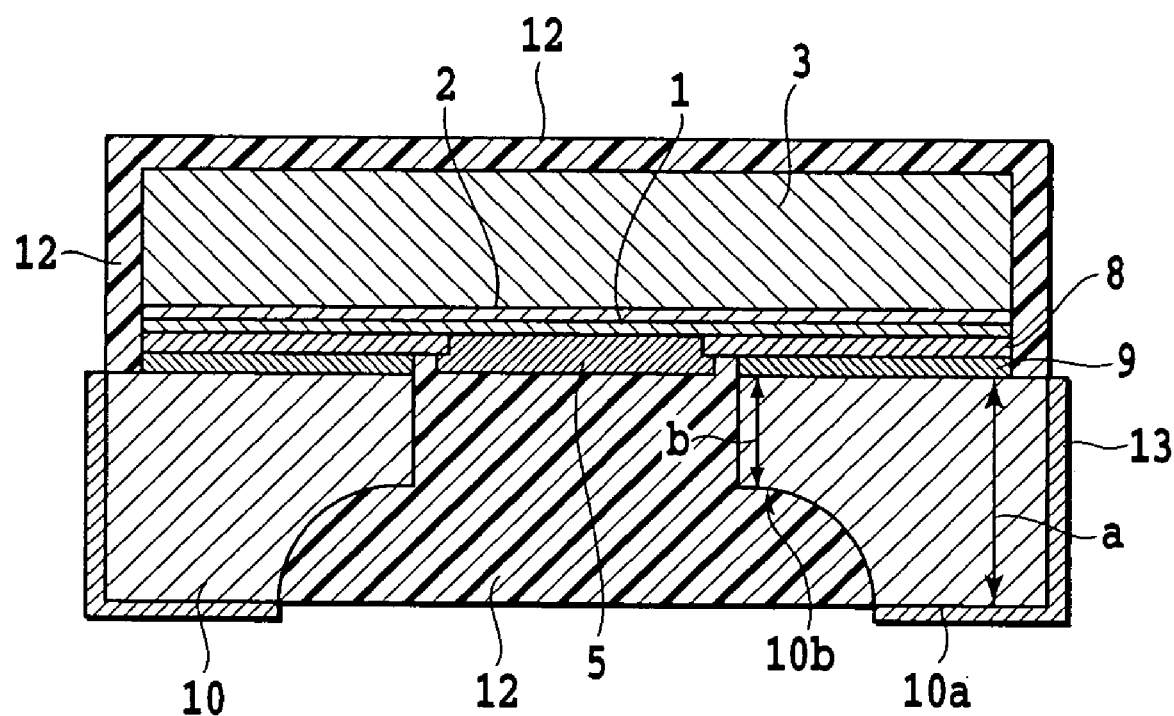
FIGS. 15–24 are each a schematic cross-sectional view illustrating a second embodiment of the Hall element in accordance with the present invention.
Figure 20:
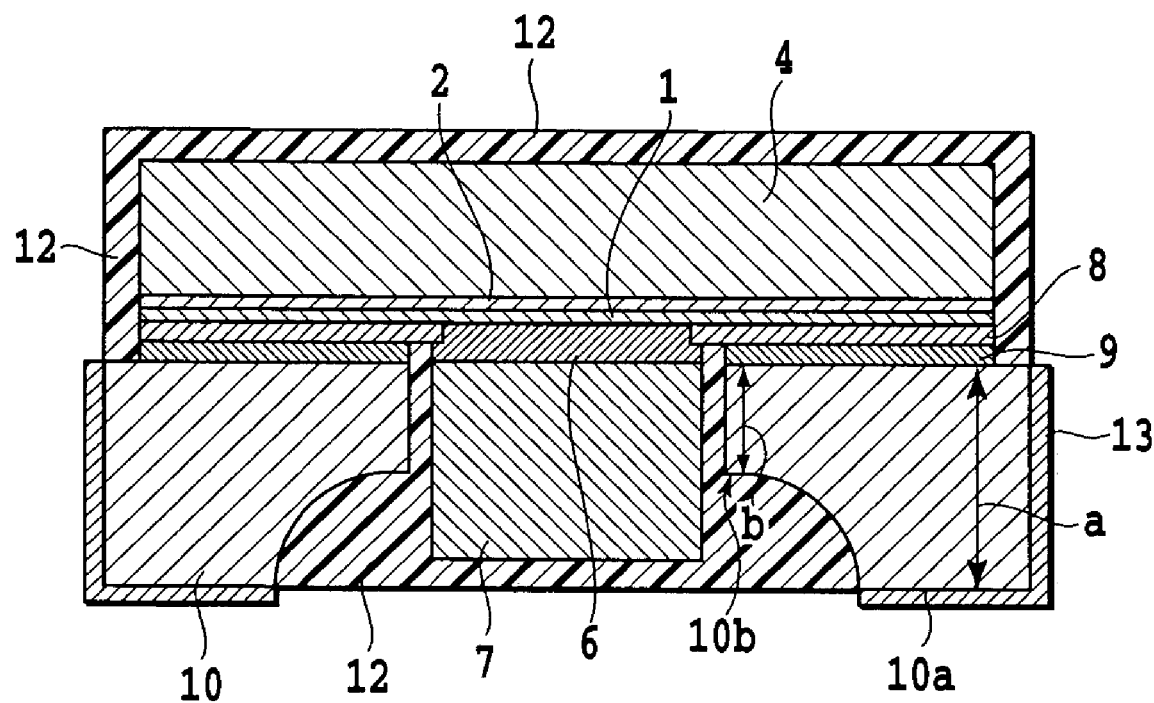

In the Hall element as shown in FIGS. 15 and 20, each lead 10 includes at least two regions—a region 10a with a first thickness (a) and a region 10b with a second thickness (b), where the first thickness (a) is greater than the second thickness (b).

The leads 10 are mounted at least on the internal electrodes 8 formed on the substrate 3. The resin 12 seals the sides of at least the portions 9 through which the internal electrodes 8 are electrically connected to the leads 10, the magneto-sensitive section 1 formed on the substrate 3, the internal electrodes 8 and the leads 10.

In addition, the surfaces of the leads 10 in the regions 10a with the first thickness (a) are exposed, thereby constituting the connecting terminals 13 for establishing the electrical connection with the outside. The cross sections of the leads 10 with the inconstant thickness between the minimum thickness and maximum thickness of the leads 10 are exposed to the sides. In other words, the leads 10 each include a bottom surface connecting electrode of the lead 10 with the first thickness (a), and a side electrode with the first thickness (a) exposed by the cutting.

Thus, in FIGS. 15 and 20, the bottom surface connecting electrodes of the leads 10 with the first thickness (a) are formed across the internal electrodes 8 of the adjacent magnetoelectric transducers with maintaining the first thickness (a), and the side electrodes with the first thickness (a) are formed by cutting the center of the two adjacent Hall element.

Figure 16:
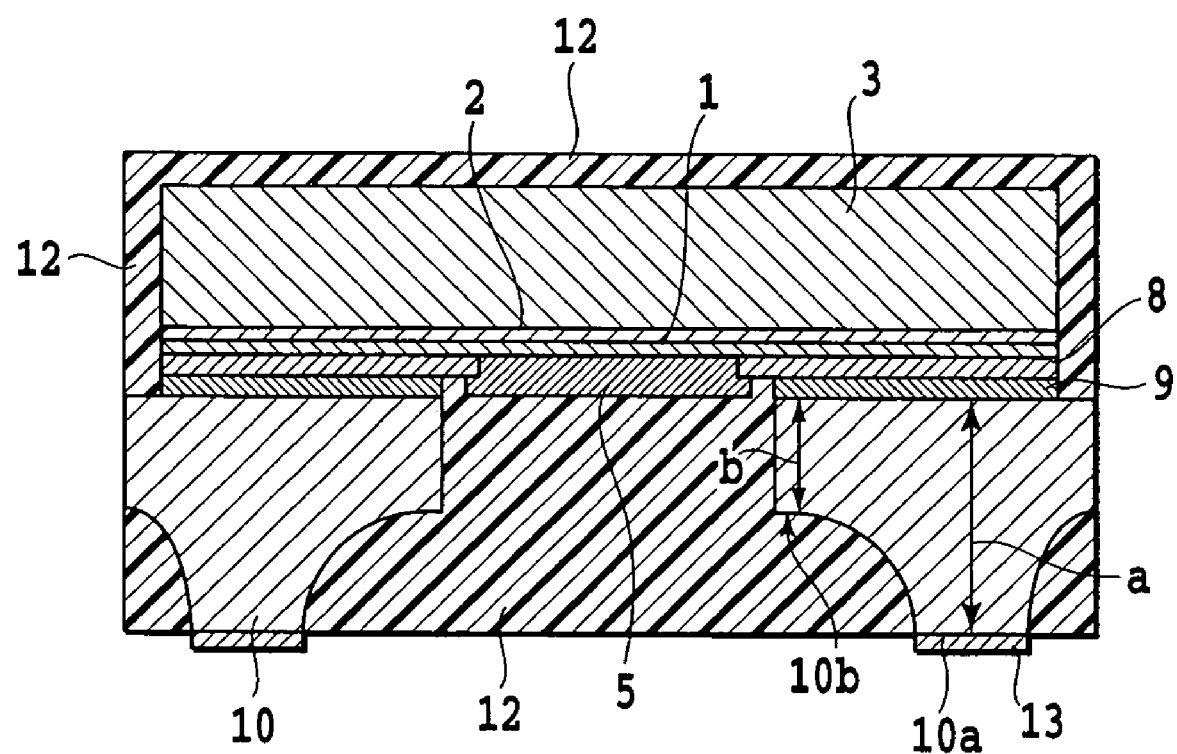
Figure 21:
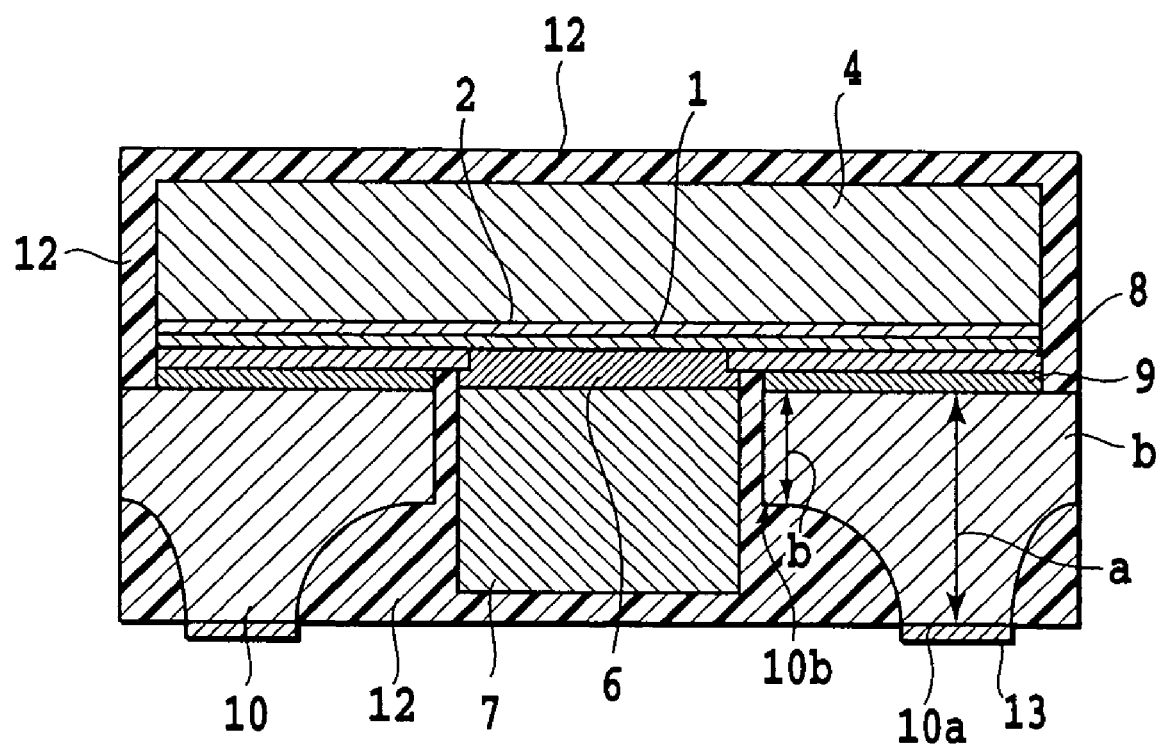

In FIGS. 16 and 21, the cross sections of the leads 10 exposed to the sides can have inconstant thickness in a range at least from the first thickness a to the second thickness b.

In FIGS. 16 and 21, the thickness of the leads 10 that extend across the internal electrodes 8 of the adjacent magnetoelectric transducers can take inconstant thickness less than the first thickness (a) and equal to or greater than the second thickness (b). The sides of the leads 10 less than the first thickness (a) are formed by forming the epoxy resin, followed by cutting its center.

Figure 17:
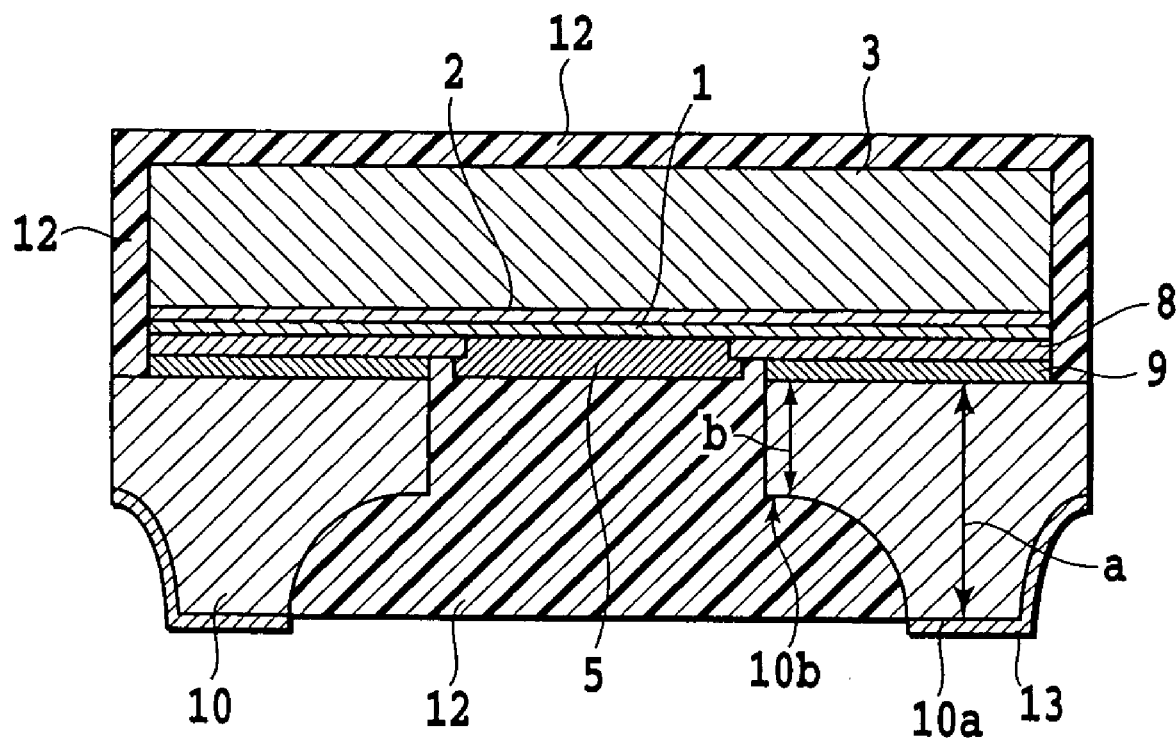
Figure 22:
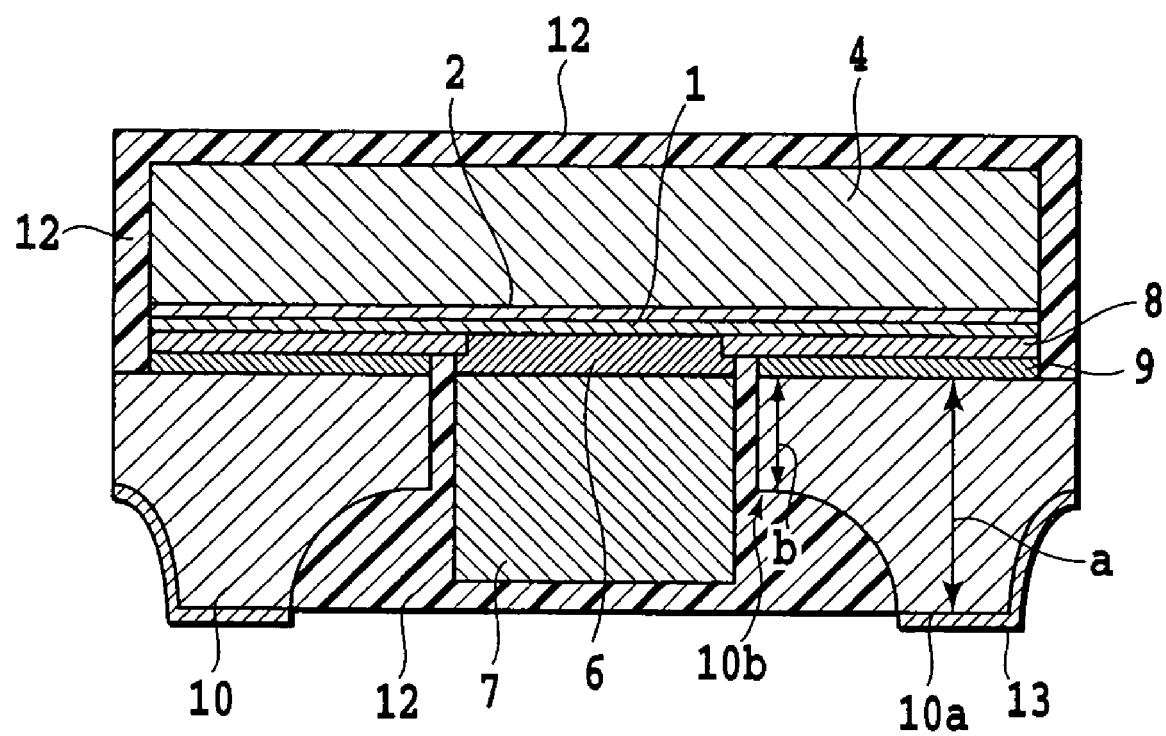

FIGS. 17 and 22 each show a case in which the leads 10 exposed to the sides each have a step height that is formed by cutting. The cut exposed sections are coated with metal coatings 13 corresponding to the external electrodes of the leads 10. In other words, the cross sections of the leads 10, which are exposed to the sides, have the first thickness (a) and the step height.

In FIGS. 17 and 22, as for the shape of the external connecting electrodes, after forming the epoxy resin in the state of FIGS. 15 and 20, the sides of the leads 10 are formed by carrying out half cut, followed by cutting the centers by a blade thinner than the half cut.

Figure 18:
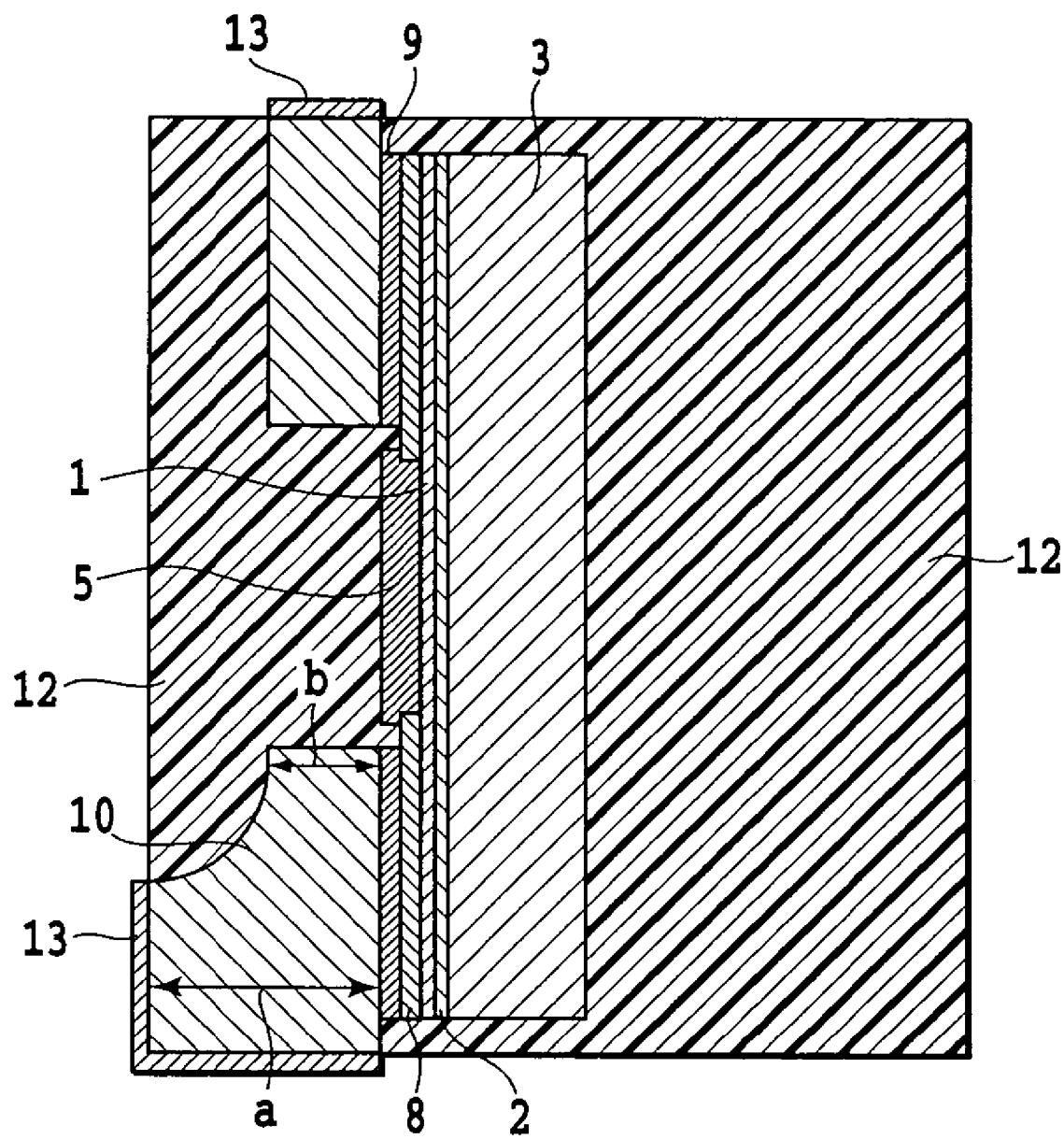
Figure 23:
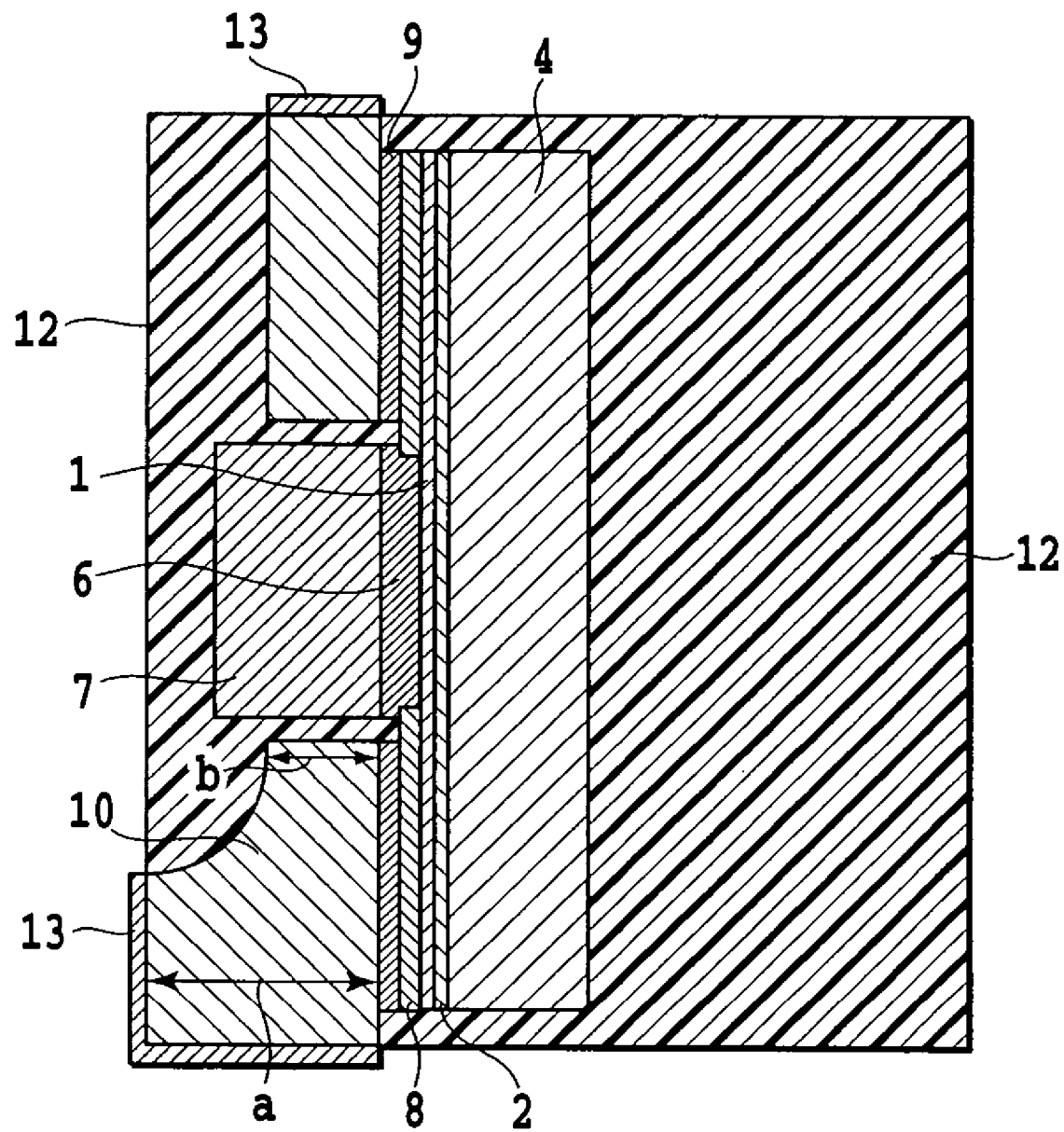

In FIGS. 18 and 23, the external connecting electrodes at which the leads 10 have the first thickness (a), and the cross sections of the leads 10 with the first thickness (a) exposed by the cutting are formed, and the cross sections of the leads 10 are used as the mounting surface.

Figure 19:
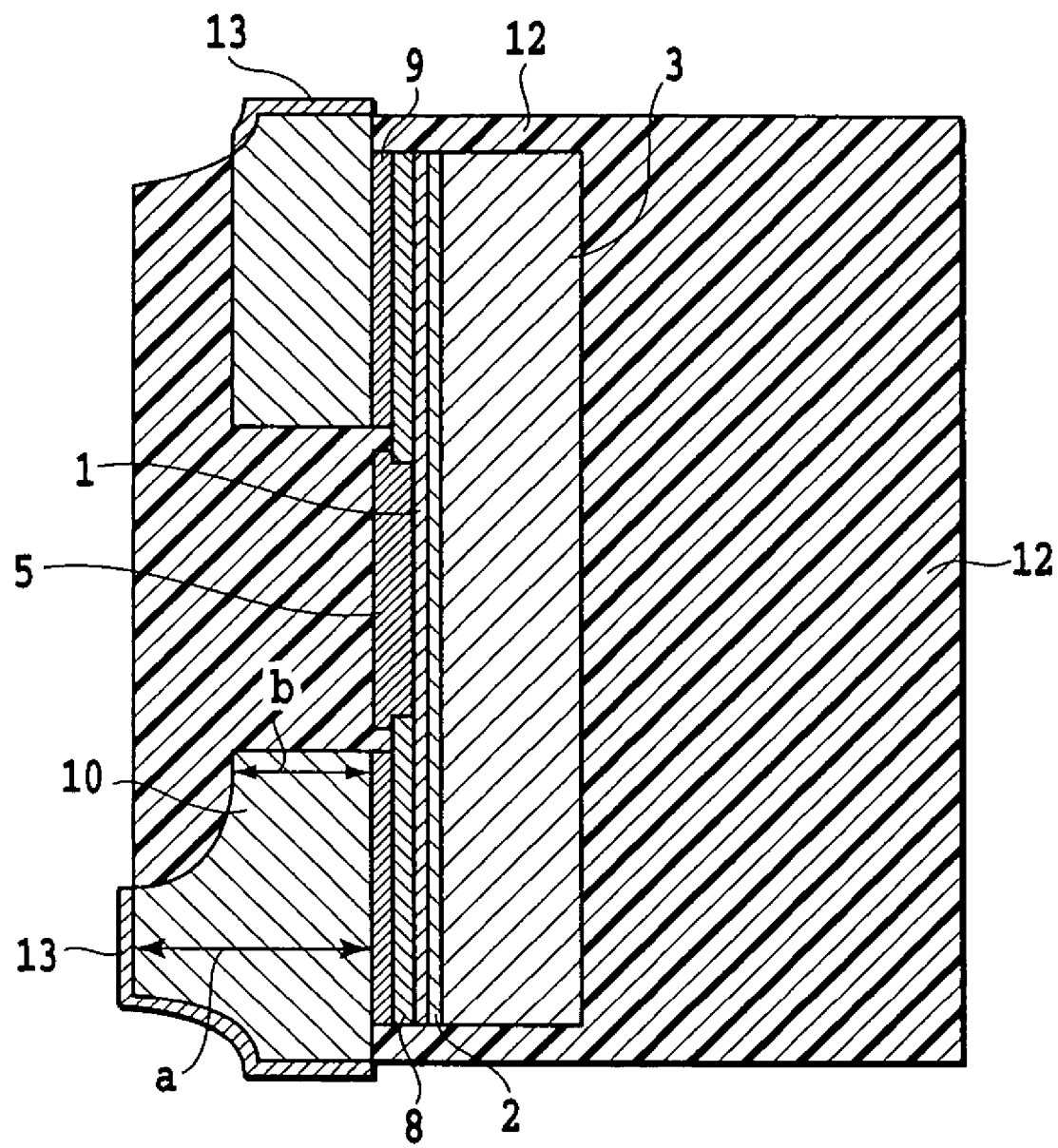
Figure 24:
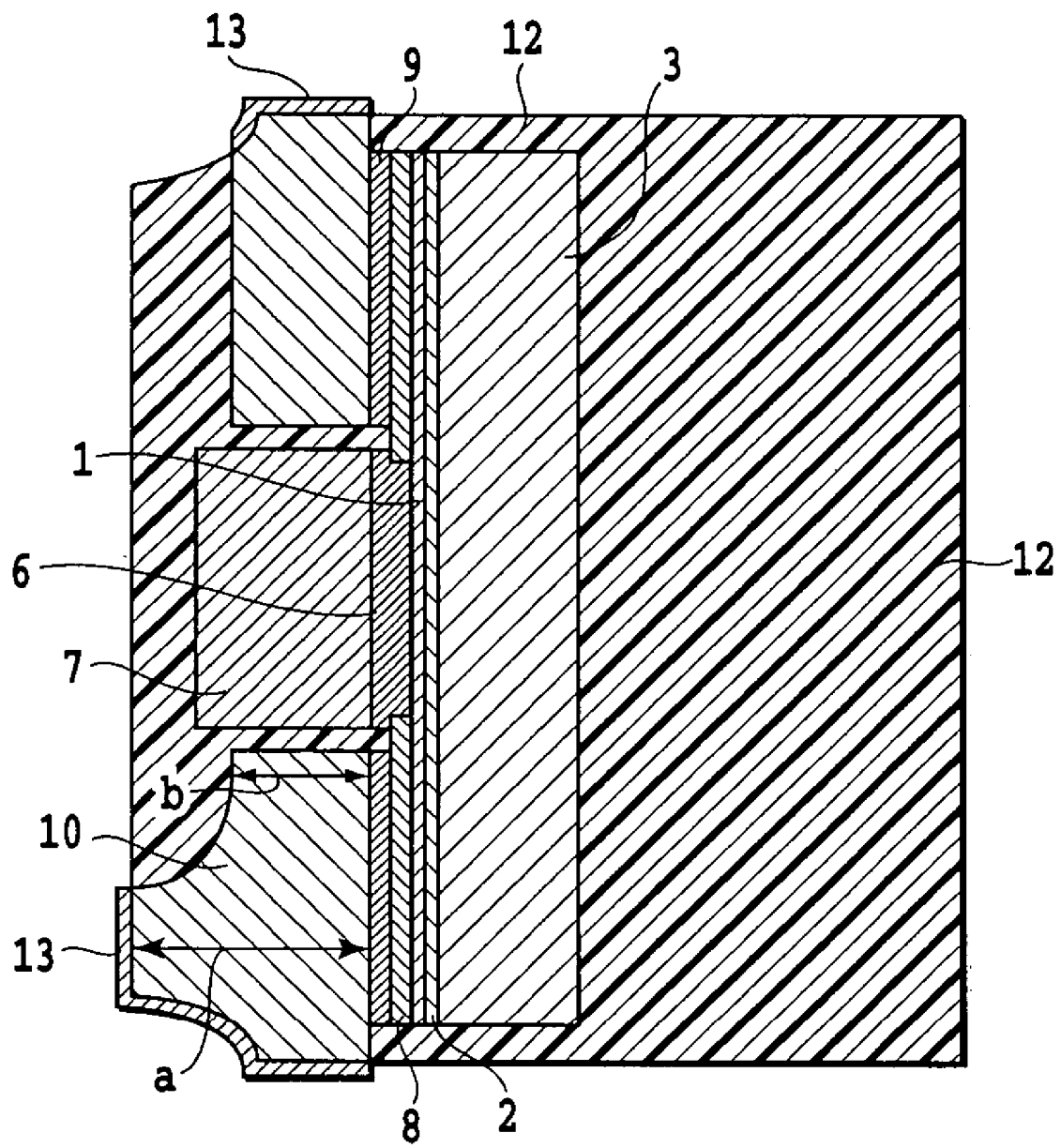

In FIGS. 19 and 24, the leads 10 exposed to the sides are cut, and the cut exposed sections are coated with the metal coatings 13 corresponding to the external electrodes of the leads 10. In other words, the external connecting electrodes, at which the leads 10 have the first thickness (a), and the cross sections of the leads 10, which have the first thickness (a) and are exposed by the cutting, are formed with the step height, and the cross sections of the leads 10 are used as the mounting surface.

Figure 25:
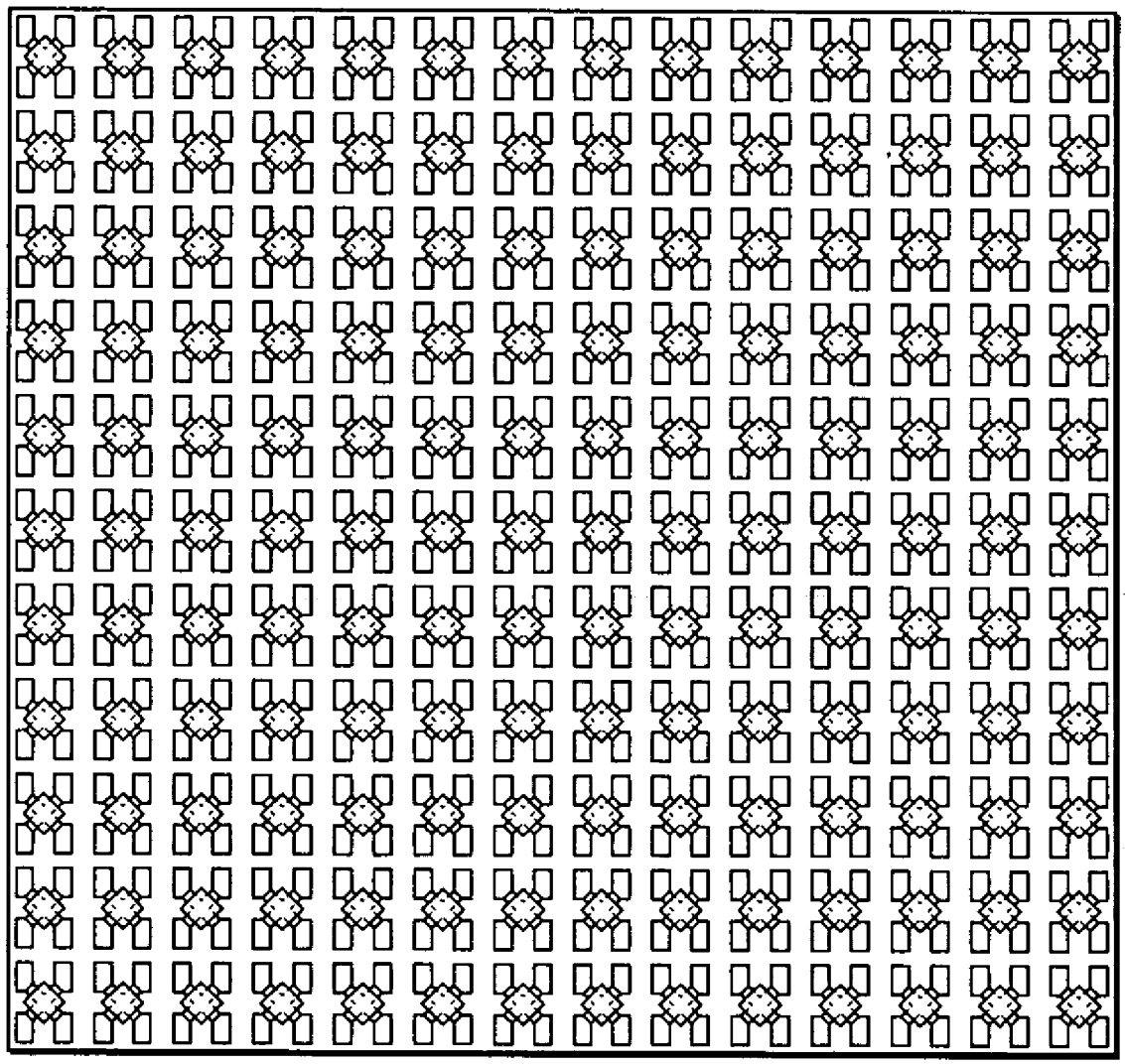
FIGS. 25–28 are each a diagram illustrating a manufacturing method of the second embodiment as shown in FIGS. 15–24.
Figure 26:
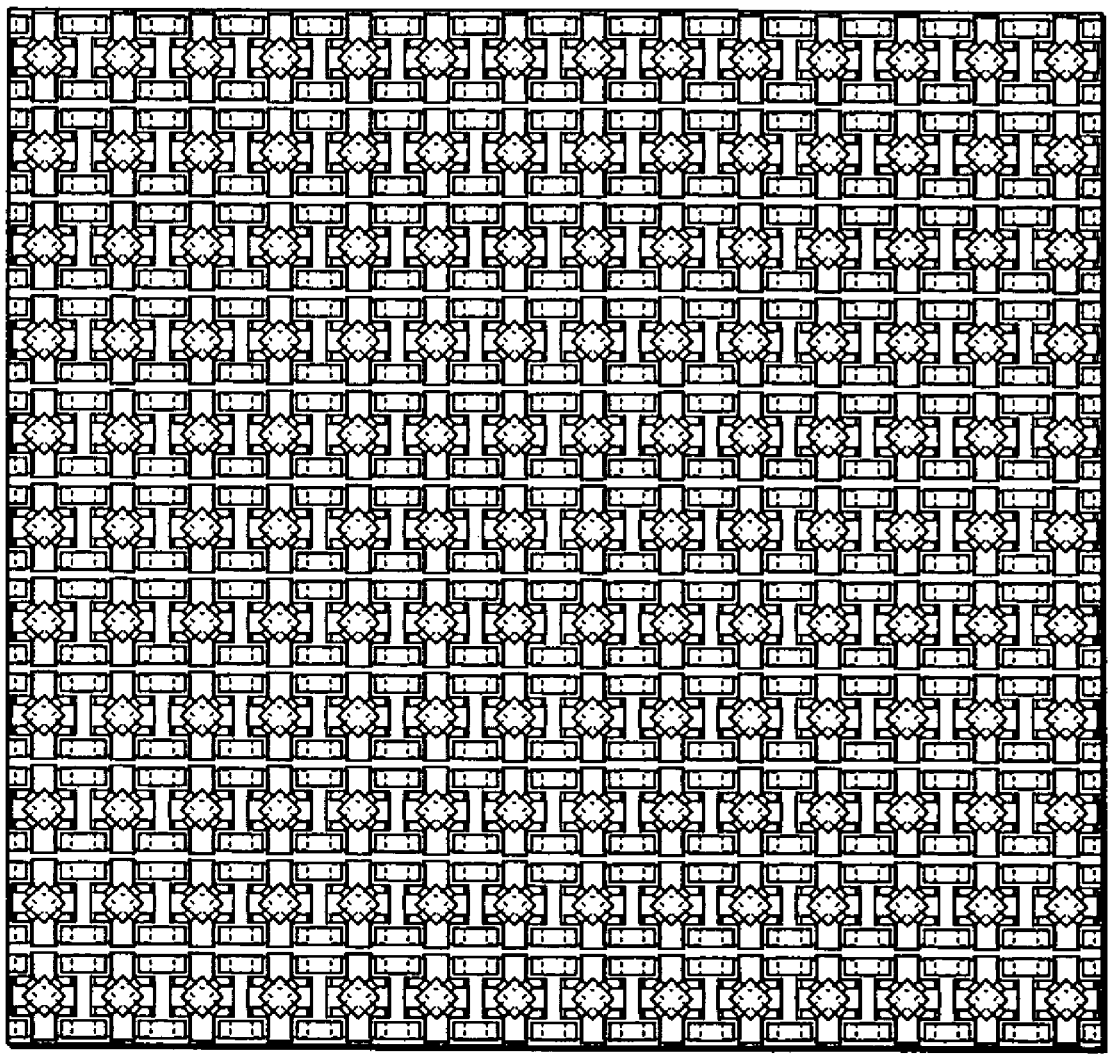
Figure 27:
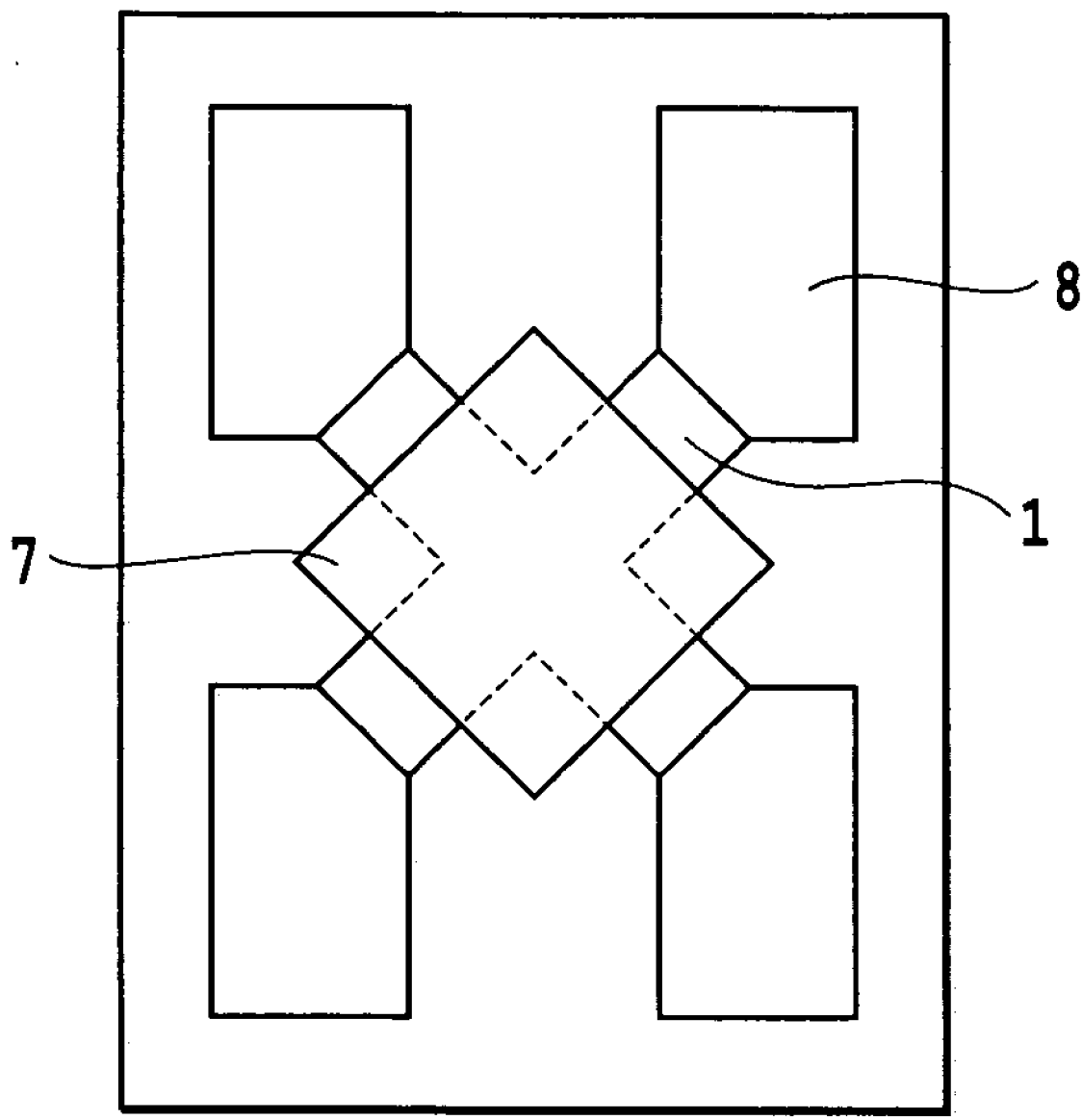
Figure 28:
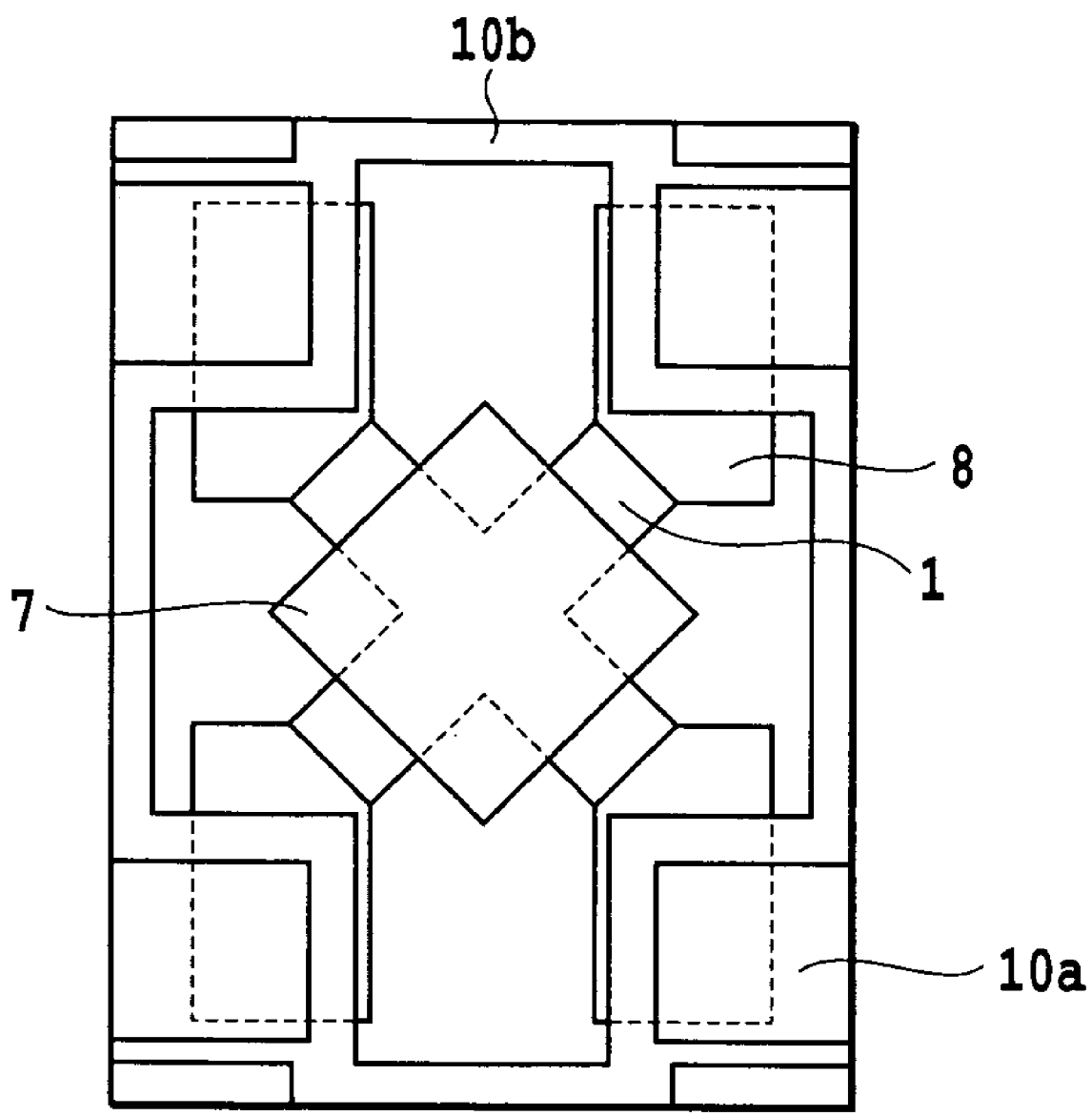

FIGS. 25–28 are views for describing manufacturing methods of the individual examples as shown in FIGS. 15–24, in which FIGS. 27 and 28 are partially enlarged views of FIGS. 25 and 26, respectively.

FIG. 25 is a view showing structures of magnetoelectric transducers provided on a high-permeability magnetic substrate. On the high-permeability magnetic substrate, that is, on the ferrite substrate 4, patterns of a large number of magnetoelectric transducers are formed, and the high-permeability magnetic chips 7 are mounted on the magneto-sensitive sections 1. In other words, a large number of magnetoelectric transducers, each of which includes the magneto-sensitive section 1, internal electrodes 8 and high-permeability magnetic chip 7, are formed on the high-permeability magnetic substrate 4. FIG. 27, which is a partially enlarged view of FIG. 25, shows the positional relationships of the internal electrodes 8, magneto-sensitive section 1 and high-permeability magnetic chip 7 of each magnetoelectric transducer.

Figure 32:
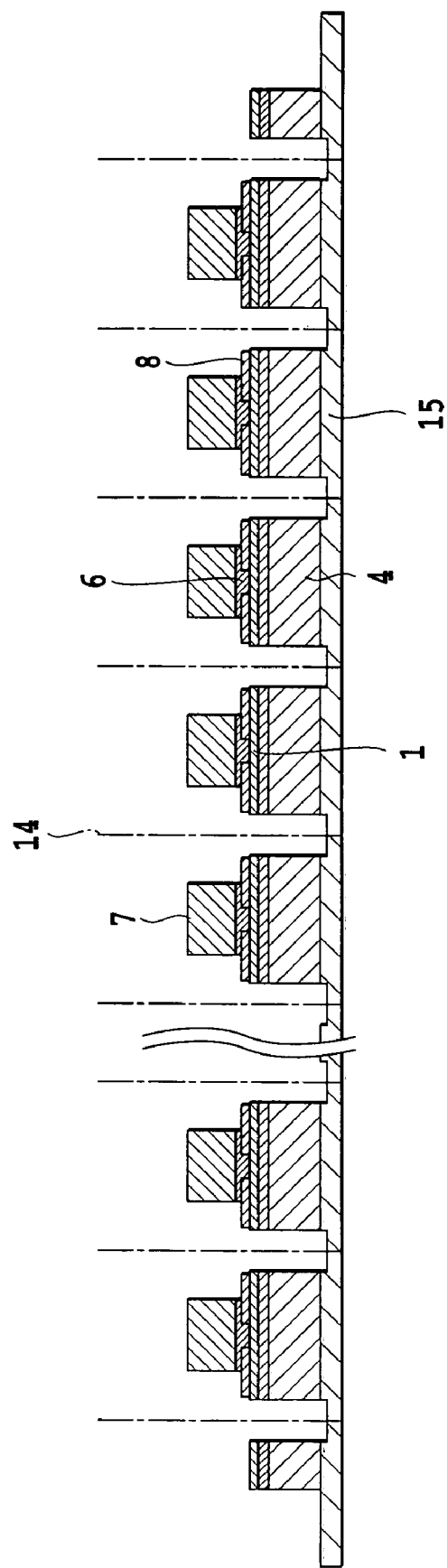

FIG. 26 is a view showing a state in which the lead frames are mounted on the patterns of the internal electrodes of the individual magnetoelectric transducers collectively. After affixing cutting tape 15 to the substrate as shown in FIG. 32, and cutting it into pieces, the first thickness regions of the lead frames with the two thicknesses are aligned to the internal electrodes 8 to mount the lead frames. In other words, after dividing into the individual magnetoelectric transducers, the lead frames with the two thicknesses are mounted collectively on the patterns of the internal electrodes of the individual magnetoelectric transducers. FIG. 28, which is a partially enlarged view of FIG. 26, shows positional relationships between the magneto-sensitive section 1, high-permeability magnetic chip 7, and the regions 10a and 10b of the leads 10 with the two thicknesses (a) and (b) of each magnetoelectric transducer.

Figure 29:
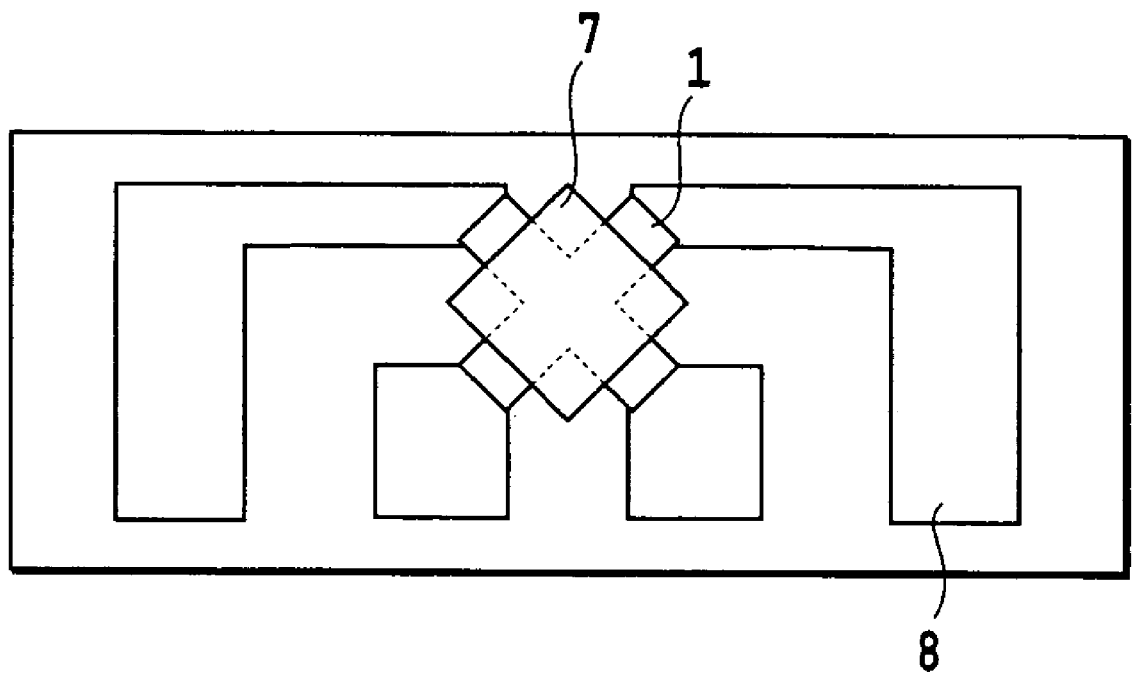
FIGS. 29 and 30 are diagrams illustrating the manufacturing method of the second embodiment as shown in FIGS. 18, 19, 23 and 24.
Figure 30:
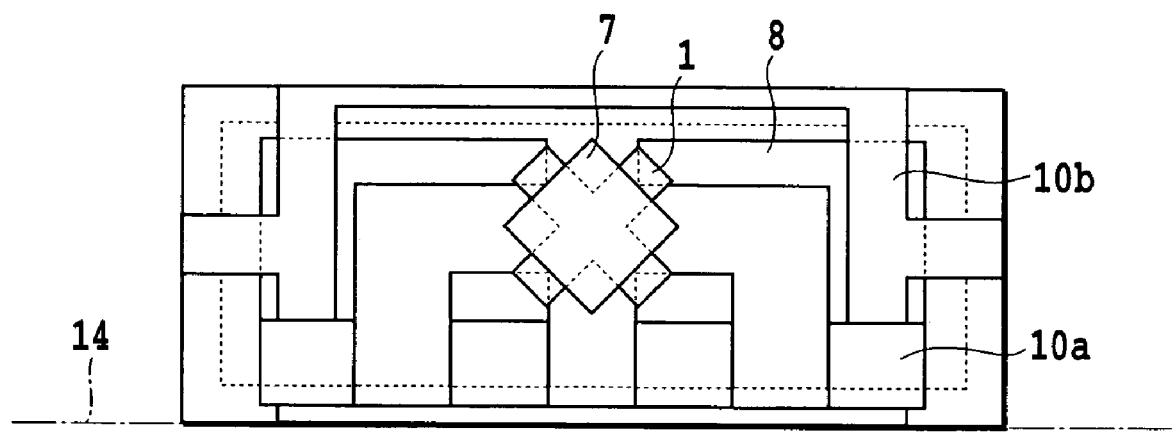

FIGS. 29 and 30 are diagrams illustrating a manufacturing method of the individual examples shown in FIGS. 18 and 19 and FIGS. 23 and 24. FIG. 29 is a partially enlarged view of the magnetoelectric transducer, and FIG. 30 is a partially enlarged view of the magnetoelectric transducer on which the lead frame with the two thicknesses is mounted.

FIG. 29 shows a pattern of the magnetoelectric transducer formed on the ferrite substrate 4 when fabricating the magnetoelectric transducer as shown in FIG. 23, on which the high-permeability magnetic chip 7 is further mounted. In addition, FIG. 30 shows a case having the lead frame mounted on the state of FIG. 29, which shows the positional relationships between the internal electrodes 8, magneto-sensitive section 1, high-permeability magnetic chip 7, and the leads 10 with the two thicknesses of each magnetoelectric transducer.

EXAMPLE 5

Process steps of fabricating the Hall element as shown in FIG. 20 will be described with reference to FIGS. 31–37.

First, a cleavage mica was used as an evaporation substrate, and an In-excess InSb thin film was formed by evaporation. Subsequently, using a method of evaporating excess Sb that forms a compound with the excess In in the InSb film, an InSb thin film of 0.7 µm thickness with the electron mobility of 46000 $cm^2$/V/sec was formed. Subsequently, a 54 mm square, 0.25 mm thick ferrite substrate 4 was prepared, and polyimide resin was dropped on the InSb thin film, on which the ferrite substrate 4 was overlaid, followed by placing a heavy weight thereon and being left for 12 hours at 200° C.

Subsequently, it was placed in the room temperature, deprived of the mica, thereby forming a wafer having the InSb thin film formed on the surface. Subsequently, the Hall element patterns were formed on the wafer by photolithography. Then, patterning of the internal electrodes was carried out, and electroless copper plating followed by electro-copper plating for thickening was made. Subsequently, after forming an etching pattern, etching was carried out to form the magneto-sensitive sections 1 and the internal electrodes 8. Each magneto-sensitive section 1 was 410 μm long and 140 μm wide. The pitch at which the Hall elements were formed was 0.95 mm in the X direction and 1.15 mm in the Y direction.

Figure 31:
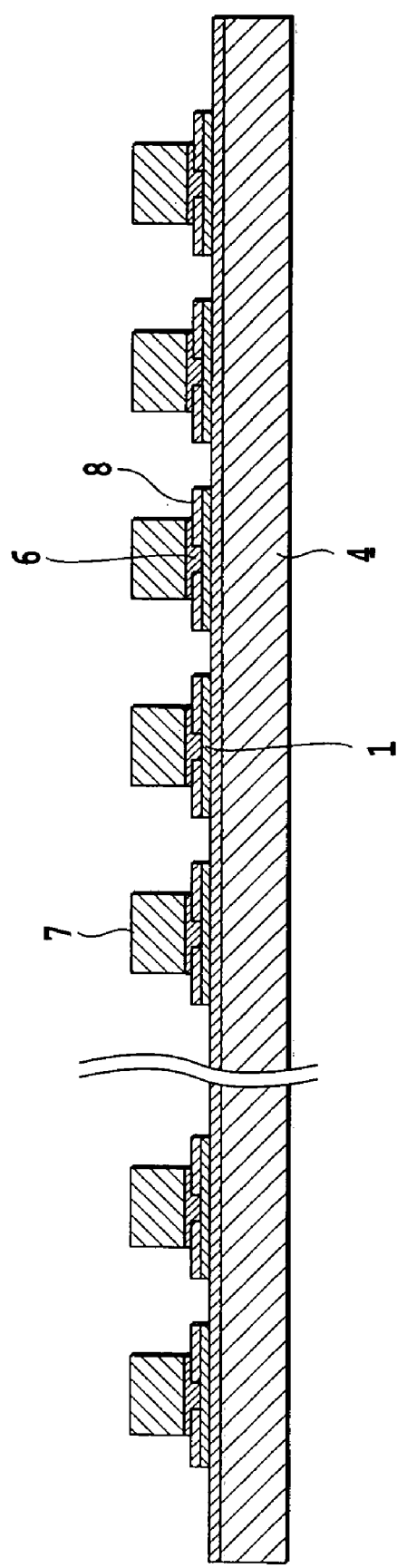
FIGS. 31–43 are each process diagram illustrating the manufacturing method of the second embodiment as shown in FIGS. 15–24.

Subsequently, as shown in FIG. 31, according to the method described in Japanese patent application publication No. 7-013987 (1995), 0.27 mm square, 0.15 mm thick, rectangular MnZn ferrite chips were mounted on the surface of the magneto-sensitive sections 1 of the semiconductor devices via an adhesive.

Subsequently, as shown in FIG. 32, the cutting tape 15 used for the dicing was affixed to the bottom surface of the ferrite substrate, followed by cutting at the foregoing pitch with a 0.35 mm thick dicing blade. The size of the pellet of each Hall element was 0.6 mm×0.8 mm square by 0.25 mm in thickness.

Figure 33:
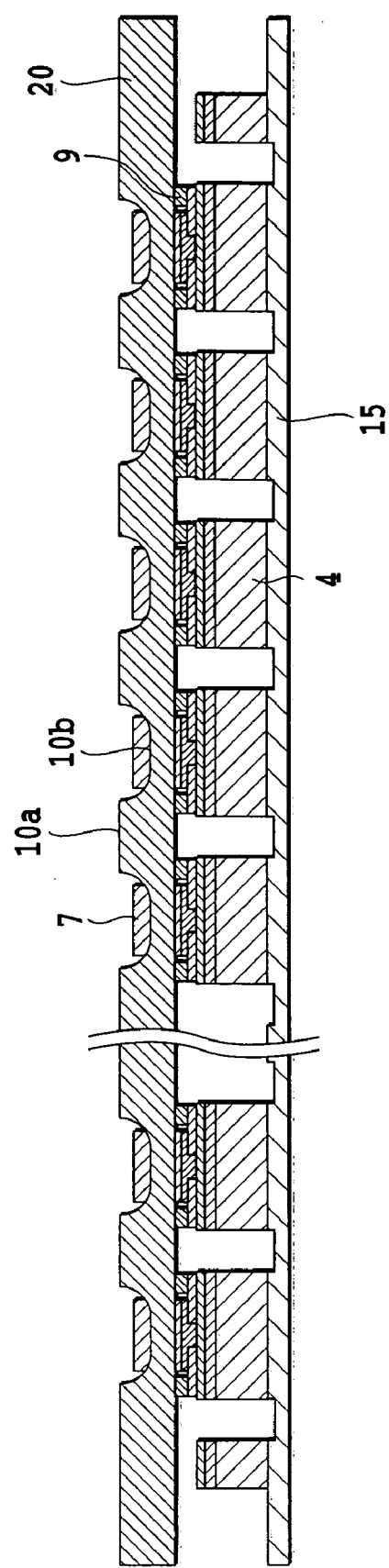
Figure 34:
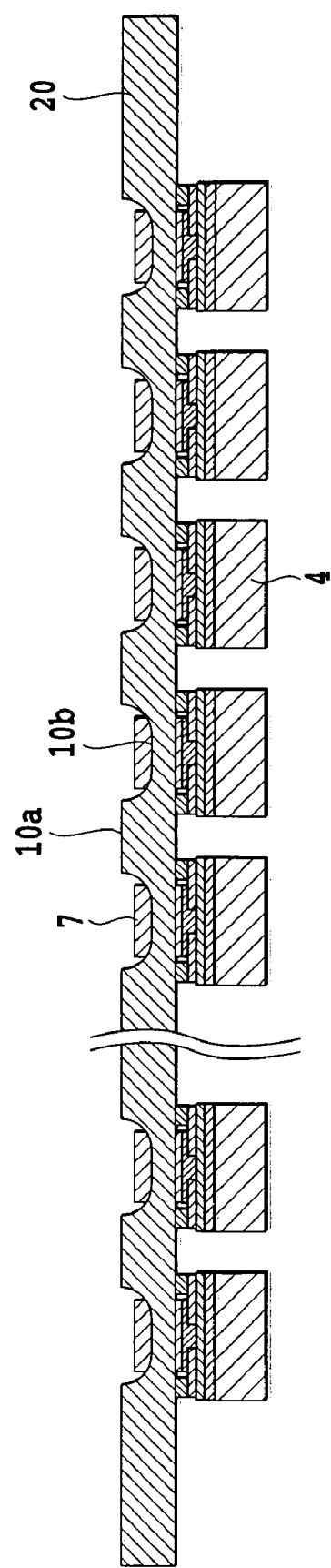

Subsequently, the internal electrodes of the pellets of the individual Hall elements were coated with a conductive resin employing Ag as a filler by stamping. Then, the lead frames 20 with the two thicknesses, the first thickness of which is 0.2 mm, were mounted thereon with aligning them to the patterns of the individual internal electrodes, followed by hardening the thermosetting conductive resin, and by electrically connecting the lead frames 20 with the internal electrodes 8 of the pellets of the individual Hall elements (FIG. 33). Afterward, the cutting tape 15 was removed. FIG. 34 is a cross sectional view showing this state.

Figure 35:
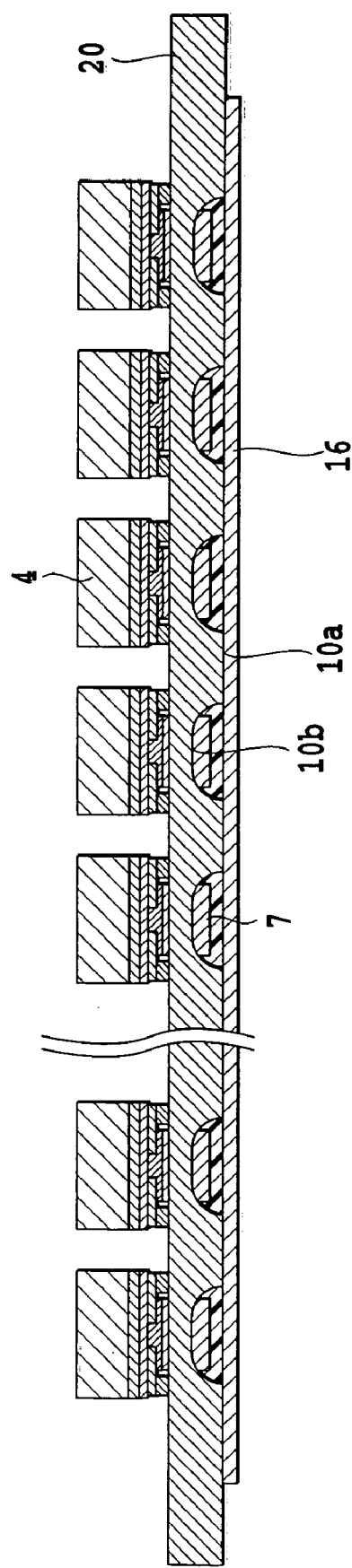

Subsequently, as shown in FIG. 35, heat-resistant tape 16 was affixing to the first thickness portion of the lead frames 20, and the ferrite substrate 4 cut into pieces was turned upside down.

Figure 36:
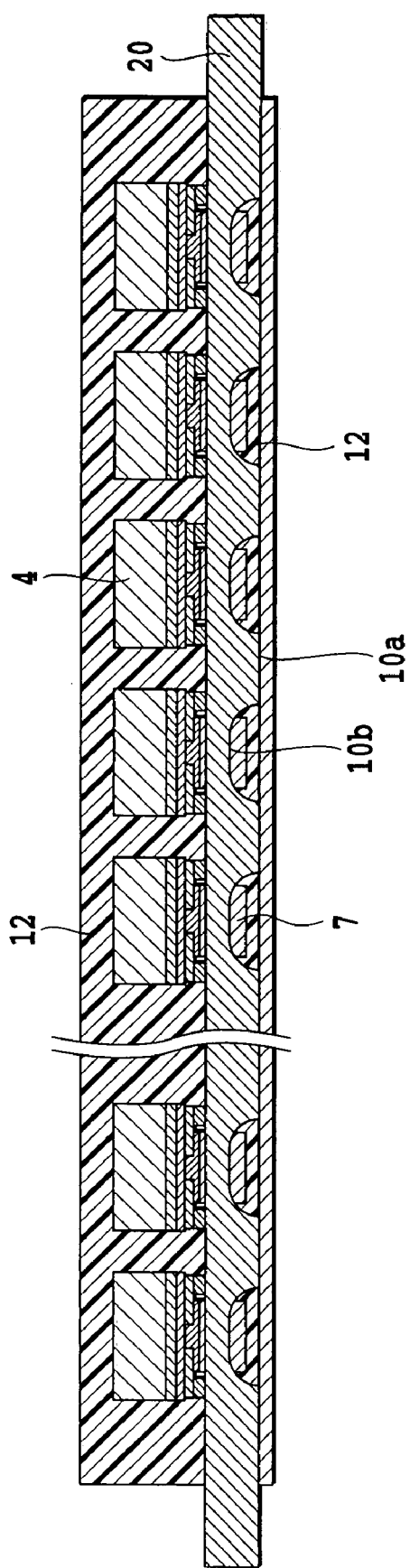

Subsequently, the technique of the transfer molding was applied as follows. First, the lead frames in the state of FIG. 35 was set in the lower mold with the cavity depth of 0.2 mm, and the upper mold with the cavity depth of 0.35 mm was closed. Then a resin was injected into the mold cavity at a temperature of 175° C. through the bottom surface and sides of the ferrite substrate of the pellets of the Hall elements divided into pieces, followed by curing after pulling out of the mold. FIG. 36 is a cross sectional view showing the state.

Subsequently, after removing the heat-resistant tape, the cutting tape used for dicing was affixed. Then, dicing was carried out along the cutting lines 14 using the 0.25 mm thick dicing blade, again, thereby exposing the first thickness (a) of the leads 10 and the sides of the leads 10. In this case, the resin used for the molding covered the ferrite substrate 4 with a thickness of 0.1 mm and the pellet sides of the individual Hall elements with a thickness of 0.05 mm.

Figure 37:
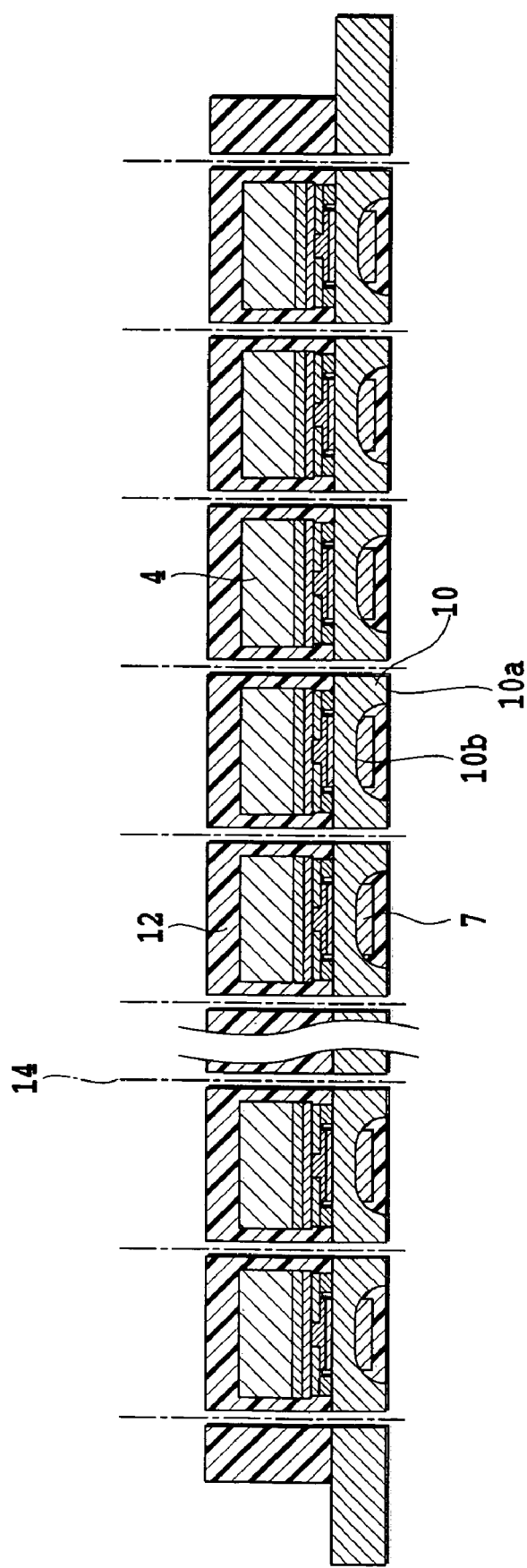

Finally, by the barrel plating, metal coating suitable for soldering was applied to the leads at bottom surfaces of the Hall elements, and to the cross sections of the leads exposed by the dicing, thereby completing the Hall elements. FIG. 37 is a cross sectional view showing the state.

Each Hall element thus formed has the cross section as shown in FIG. 20. The present example of the Hall element has a size of 0.7×0.9 mm square by 0.55 mm thickness. The sensitivity of the Hall element was on average about 356 mV for the input voltage of 1 V in the magnetic flux density of 0.05 T.

EXAMPLE 6

A high-permeability magnetic substrate bearing semiconductor thin films was fabricated as follows. A 3000 angstrom $SiO_2$ was formed on a mirror-finished surface of a 54 mm square, 0.25 mm thick ferrite substrate 4. Then, an InSb thin film with the electron mobility of 24000 $cm^2$/V/sec was formed thereon by the evaporation as in the example 5.

Subsequently, the Hall element patterns were formed on the wafer by the photolithography. The patterning of the internal electrodes and magneto-sensitive sections was carried out, followed by pattern formation by etching. The internal electrodes were formed by depositing Ni and Au by the liftoff evaporation. Each magneto-sensitive section 1 has a length of 350 μm and width of 140 μm. The pitch of the pellets of the individual Hall elements was 0.95 mm in the X direction and 1.15 mm in the Y direction. From then on, the Hall elements were completed as in the example 5.

Each Hall element thus formed has the cross section as shown in FIG. 20. The present example of the Hall element has a size of 0.7×0.9 mm square by 0.55 mm thickness. The sensitivity of the Hall element was on average about 190 mV for the input voltage of 1 V in the magnetic flux density of 0.05 T.

EXAMPLE 7

Another process steps for manufacturing the Hall element as shown in FIG. 20 will be described with reference to FIGS. 38–43.

A substrate, on which a large number of Hall elements were formed, was manufactured as in the example 5. More specifically, a semiconductor thin film constituting the magneto-sensitive section was formed on the 0.25 mm thick ferrite substrate 4 consisting of the high-permeability magnetic substrate. Then, after forming the internal electrodes, 0.3 mm×0.3 mm square, 0.1 mm thick ferrite chips were mounted on the magneto-sensitive sections. The pitch between the individual Hall elements was 0.88 mm in the X direction and 0.88 mm in the Y direction.

Subsequently, the cutting tape 15 used for dicing was affixed to the bottom surface of the ferrite substrate, followed by dicing at the foregoing pitch using the 0.08 mm thick dicing blade. The ferrite substrate 4 of the pellet of each Hall element, which had a structure including the ferrite chip mounted on the ferrite substrate for each Hall element, had a size of 0.8 mm×0.8 mm square by 0.25 mm thickness. Afterward, the pellets of the diced Hall elements were separated from the cutting tape 15.

Figure 38:
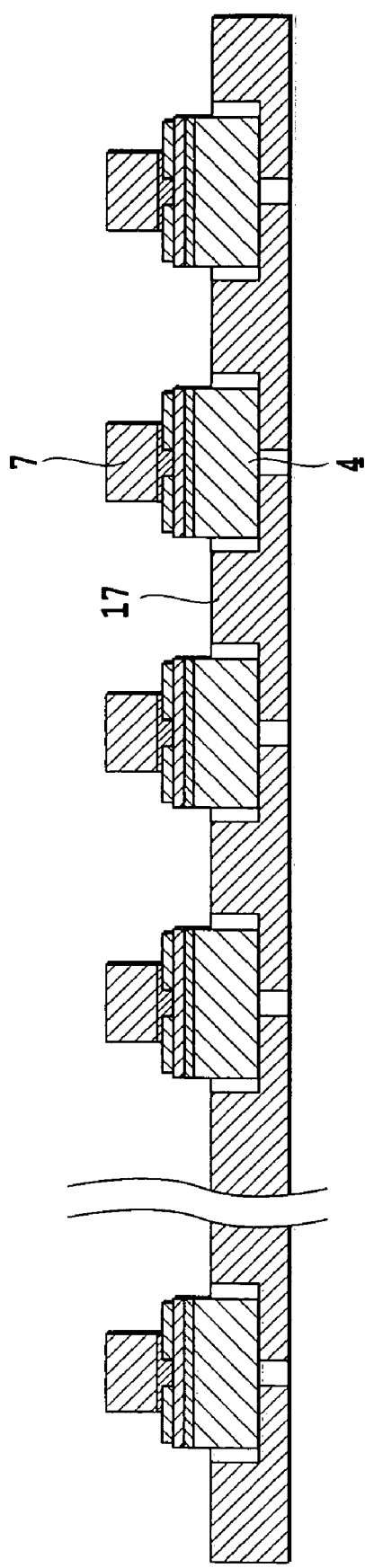

Subsequently, as shown in FIG. 38, the pellets of the Hall elements were fitted to all the pellet fitting holes of a tray plate 17 as follows with the internal electrodes facing upward. First, the tray plate 17 was prepared which had a predetermined number of pellet fitting holes similar to the pellet of the Hall element at a pitch of 1.45 mm in the X direction and 2.05 mm in the Y direction. The tray plate was placed on a suction box, and was supplied with a greater number of pellets of the Hall elements than is necessary for the pellet fitting holes. After covering the tray plate 17 to prevent the pellets of the Hall elements from being dropped, the suction box was vibrated, oscillated or rotated in its entirety so that the pellets of the Hall elements fitted to the pellet fitting holes at a certain probability were caught by suction through holes communicating from the fitting holes to the suction box. Thus all the pellets of the Hall elements were aligned on the tray plate 17.

Figure 39:
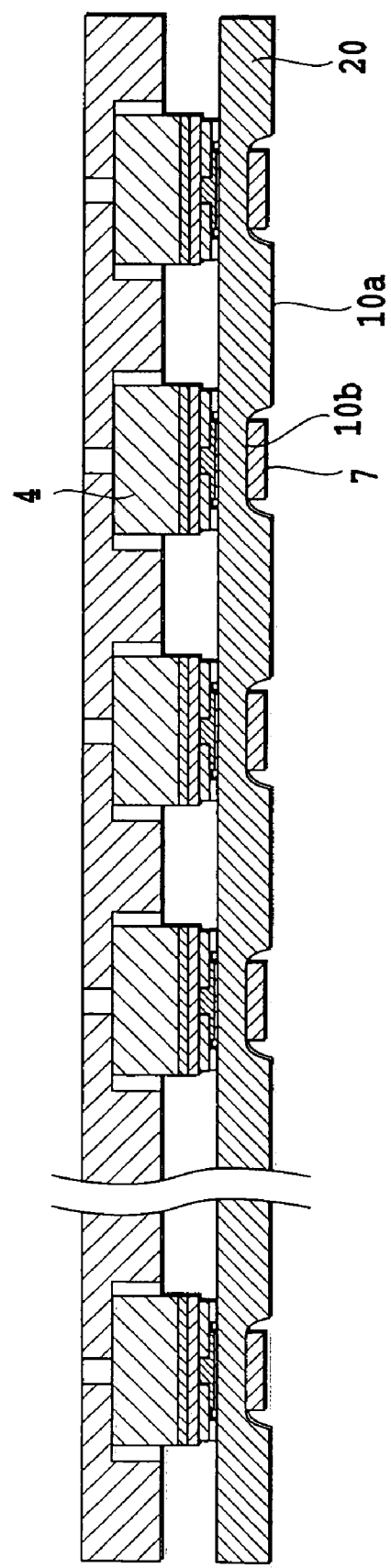

Subsequently, as shown in FIG. 39, lead frames 20 with two thicknesses, a first thickness of which is 0.15 mm, was placed underneath, followed by applying coatings of a conductive resin using Ag as a filler to desired locations of the lead frames 20 by the stamping. Then, after aligning the locations coated with the conductive resin to the patterns of the internal electrodes of the pellets of the individual Hall elements arrayed on the tray plate, the suction box was turned off. Thus, the pellets of the Hall elements were mounted on the lead frames 20 from the tray plate 17.

Figure 40:
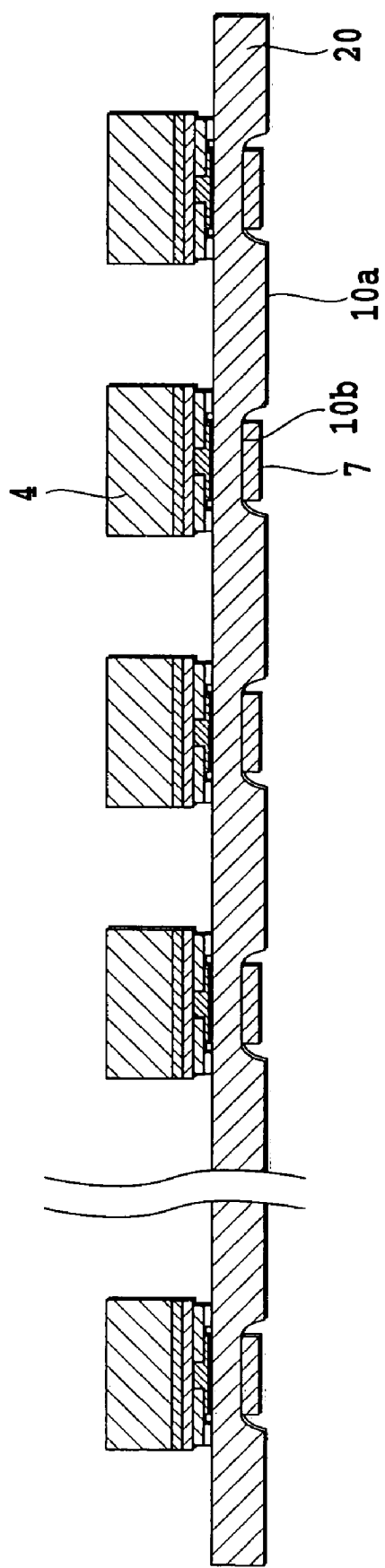

Subsequently, as shown in FIG. 40, after hardening the thermosetting conductive resin, the internal electrodes 8 of the pellets of the individual Hall elements were electrically connected to the lead frames 20.

Figure 41:
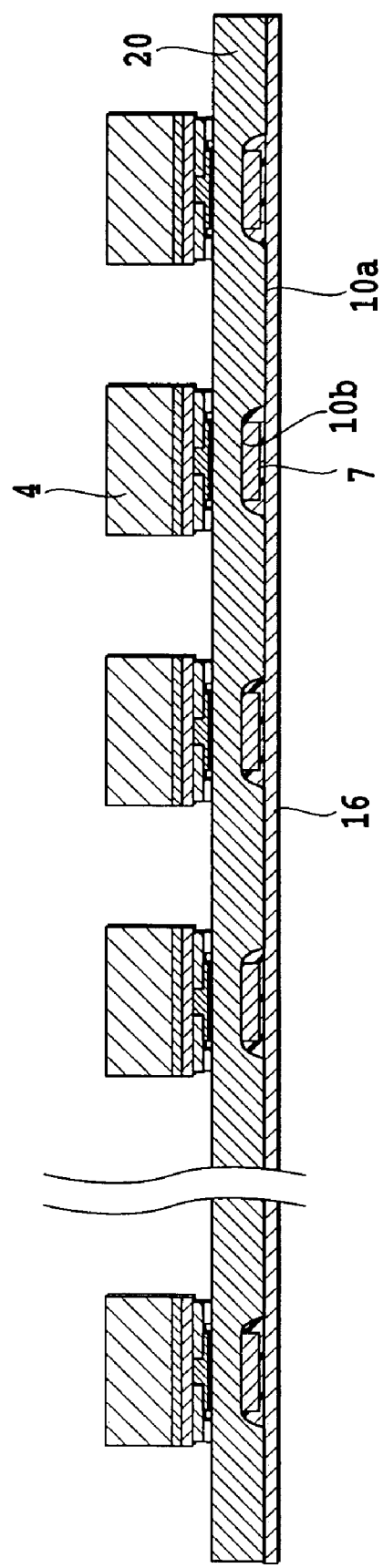

Subsequently, as shown in FIG. 41, the heat-resistant tape 16 was affixed to the regions 10a of the lead frames 20 with the first thickness (a).

Figure 42:
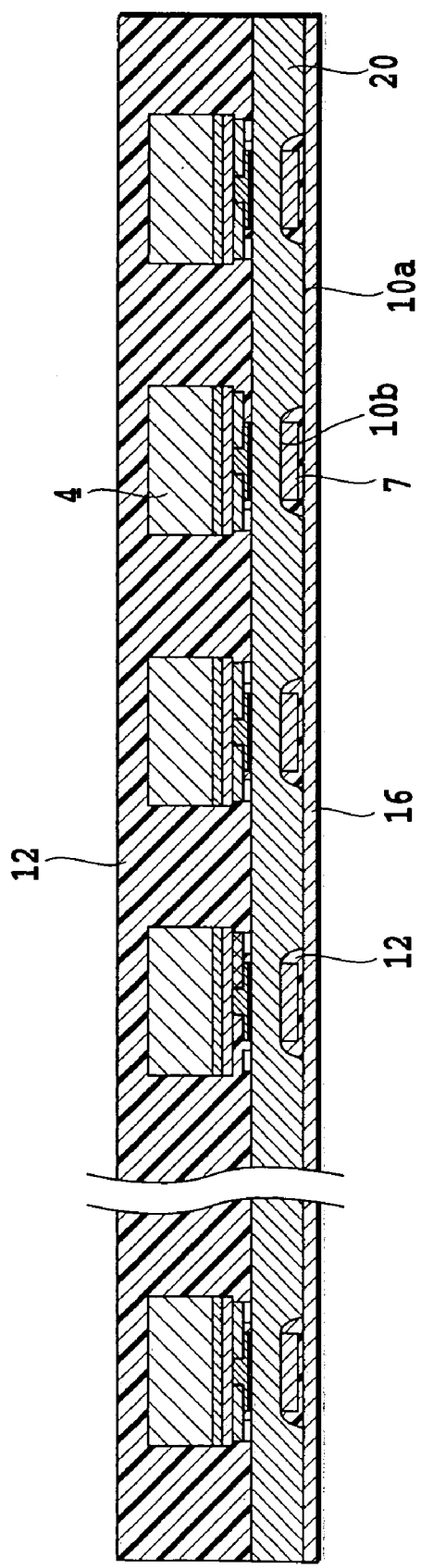

Afterward, the transfer molding was carried out as follows. First, the lead frames in the state of FIG. 41 were set in a 0.15 mm deep lower mold. Second, an upper mold with a cavity depth of 0.35 mm was fitted, and a resin was injected at a temperature of 175° C. through the bottom surfaces or sides of the ferrite substrates which were cut into pieces, followed by pulling out the mold and by curing. FIG. 42 is a cross sectional view showing this state.

Figure 43:
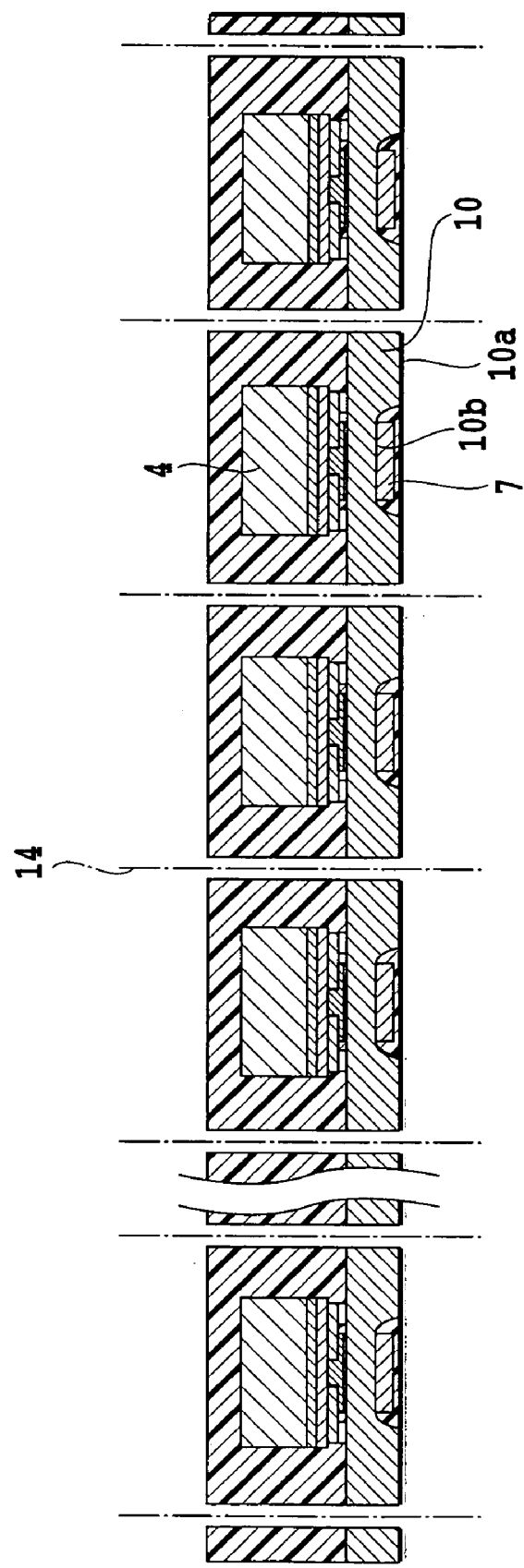
Figure 44A:
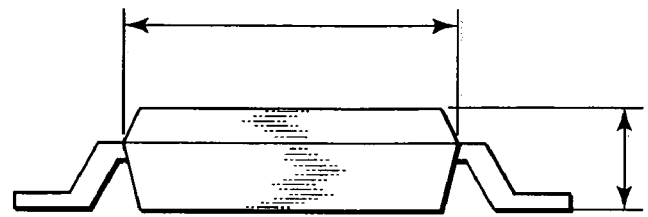
FIGS. 44A and 44B are views showing a shape of a conventional Hall element.
Figure 44B:
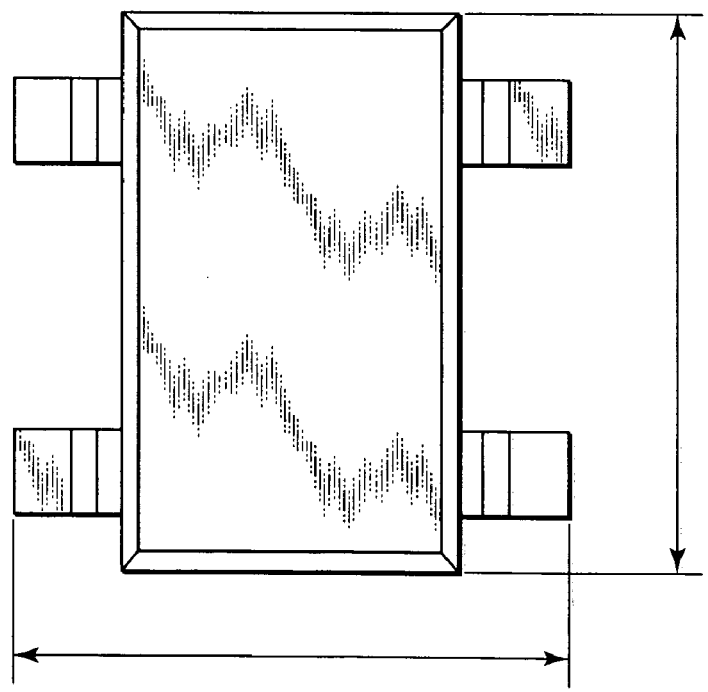

Subsequently, as shown in FIG. 43, after removing the heat-resistant tape, the cutting tape used for dicing was affixed. Then, dicing was carried out along the cutting lines 14 indicating the pitch of the pellets of the Hall elements using the 0.25 mm thick dicing blade, again, thereby exposing the first thickness (a) of the leads 10 and the sides of the leads 10. In addition, the resin used for the molding covered the ferrite substrate 4 with a thickness of 0.1 mm and the ferrite substrate sides of the pellets of the individual Hall elements with a thickness of at least 0.2 mm.

Finally, the barrel plating was carried out to apply metal coatings suitable for soldering to the leads at the bottom surfaces of the Hall elements, and to the cross sections of the leads exposed by the dicing, thereby completing the Hall elements.

Each Hall element thus formed has the cross section as shown in FIG. 20. The present example of the Hall element has a size of 1.2×1.8 mm square by 0.50 mm thickness. The sensitivity of the Hall element was on average about 240 mV for the input voltage of 1 V in the magnetic flux density of 0.05 T.

EXAMPLE 8

To manufacture the Hall element as shown in FIG. 15, cleavage mica was used as an evaporation substrate, and an In-excess InSb thin film was formed by evaporation, first. Subsequently, using a method of evaporating excess Sb that forms a compound with the excess In in the InSb film, an InSb thin film of 0.7 μm thickness with the electron mobility of 46000 cm$^2$/V/sec was formed. Subsequently, a 54 mm square, 0.2 mm thick alumina substrate 3 was prepared, and polyimide resin was dropped on the InSb thin film, on which the alumina substrate 3 was overlaid, followed by placing a heavy weight thereon and being left for 12 hours at 200° C. Subsequently, it was placed in the room temperature, deprived of the mica, thereby forming a wafer having the InSb thin film formed on the surface.

Subsequently, the Hall element patterns were formed on the wafer by photolithography. Then, patterning of the internal electrodes was carried out, and electroless copper plating followed by electro-copper plating for thickening was made. Subsequently, after forming an etching pattern, etching was carried out to form the magneto-sensitive sections 1 and the internal electrodes 8. Each magneto-sensitive section 1 was 350 μm long and 170 μm wide. Subsequently, the solder resist 5 was formed on the magneto-sensitive sections 1. In this case, the solder resist was applied to the thickness of 30 μm using a spin coater such that it covered at least magneto-sensitive sections 1 through the photolithography. The pitch of the individual Hall elements was 0.9 mm in the X direction and 1.1 mm in the Y direction.

Subsequently, the cutting tape 15 used for dicing was affixed to the bottom surface of the alumina substrate, followed by dicing at the foregoing pitch using a 0.3 mm thick dicing blade. The pellet for each Hall element was 0.6 mm×0.8 mm square by 0.15 mm thickness.

Subsequently, the internal electrodes of the pellets of the individual Hall elements were coated with a conductive resin employing Ag as a filler by the stamping. Then, the lead frames 20 with the two thicknesses, the first thickness of which was 0.15 mm, were mounted thereon with aligning them to the patterns of the individual internal electrodes, followed by hardening the thermosetting conductive resin, and by electrically connecting the internal electrodes 8 of the pellets of the individual Hall elements to the lead frames 20.

Subsequently, print coating of an epoxy resin was carried out as follows using a screen printing technique in a vacuum. First, a set of the lead frames in the state of FIG. 35 was placed on the stage of a printer using a metal mask with a 0.2 mm thick opening. Then the print coating of the epoxy resin was carried out in the vacuum with depressing the periphery of the lead frames with the metal mask. After hardening the thermosetting epoxy resin and removing the heat-resistant tape 16, the dicing was carried out using a 0.2 mm thick blade. Then, as in the example 5, the Hall elements were completed.

Each Hall element thus formed has the cross section as shown in FIG. 15. The present example of the Hall element has a size of 0.7×0.9 mm square by 0.35 mm thickness. The sensitivity of the Hall element was on average about 110 mV for the input voltage of 1 V in the magnetic flux density of 0.05 T.

EXAMPLE 9

To manufacture the Hall element as shown in FIG. 23, the same method as that of the example 5 was taken. First, the magneto-sensitive sections 1 and the internal electrodes 8 were formed. Then, a 0.27 mm square, 0.1 mm thick rectangular ferrite chip was placed on each magneto-sensitive section 1 via an adhesive. The magneto-sensitive section 1 was 350 μm long and 140 μm wide. Thus, the patterns were formed on the wafer as shown in the partially enlarged view of FIG. 29. The pitch of the individual Hall elements was 2.5 mm in the X direction and 0.8 mm in the Y direction.

Subsequently, the cutting tape 15 used for dicing was affixed to the bottom surface of the ferrite substrate, followed by the dicing at the foregoing pitch using the 0.3 mm thick dicing blade. The pellet of each Hall element was 2.2 mm×0.5 mm square by 0.25 mm thickness.

Subsequently, the internal electrodes of the pellets of the individual Hall elements were coated with a conductive resin employing Ag as a filler by stamping. Then, the lead frames 20 with the two thicknesses, the first thickness of which was 0.15 mm, were mounted thereon with aligning them to the patterns of the individual internal electrodes, followed by hardening the thermosetting conductive resin, and by electrically connecting the internal electrodes 8 of the pellets of the individual Hall elements to the lead frames 20. Afterward, the Hall elements were completed as in the example 5 except that the transfer molding was carried out by setting lead frames in the state of FIG. 35 in the lower mold with a cavity depth of 0.15 mm, and that the upper mold had a cavity depth of 0.55 mm, and the dicing was carried out with a 0.2 mm thick blade.

Each Hall element thus formed has the cross section as shown in FIG. 23. The present example of the Hall element has a size of 2.3×0.6 mm square by 0.7 mm thickness. The sensitivity of the Hall element was on average about 194 mV for the input voltage of 1 V in the magnetic flux density of 0.05 T. As shown in FIG. 23, a surface of each lead 10 in the first thickness region 10*a*, which constitutes the electrical connecting terminal to the outside, is exposed adjacently to and in parallel with a side of a surface of the rectangular, thereby constituting the side electrodes. The cross section cut by the dicing, which constitutes another plane adjacent to the side, becomes the mounting surface, thereby implementing the 0.6 mm high Hall element for detecting the horizontal magnetic flux density.

EXAMPLE 10

To manufacture the Hall element as shown in FIG. 24, the process as that of the example 9 was carried out up to the transfer molding, that is, up to the state of FIG. 36.

Subsequently, the cutting tape 15 used for dicing was affixed to the bottom surface of the ferrite substrate. Then using the 0.35 mm thick dicing blade, half cut was carried out in one direction at 0.8 mm pitch. In this case, the cutting line 14 shown in FIG. 30 was used as the center line of the blade, and the cutting depth was adjusted to 0.1 mm from the surface of the leads with the first thickness.

Subsequently, using the 0.2 mm thick dicing blade, full cut was carried out at the pitch of 0.8 mm in the Y direction and 2.5 mm in the X direction with employing the cutting line 14 as shown in FIG. 30 as the center line of the blade. Afterward, the Hall elements were completed as in the example 5.

Each Hall element thus formed has the cross section as shown in FIG. 24. As in the example 10, the present example of the Hall element has a size of 2.3×0.6 mm square by 0.7 mm thickness, and a side constituting each external connecting electrodes is cut. As shown in FIG. 24, a surface of each lead 10 in the first thickness region 10*a*, which constitutes the electrical connecting terminal to the outside, is exposed adjacently to and in parallel with a side of a surface of the rectangular to constitute the side electrode, and the side is cut off. The cross section cut by the dicing, which constitutes another plane adjacent to the side, becomes the mounting surface, thereby implementing the 0.6 mm high Hall element for detecting the horizontal magnetic flux density.

INDUSTRIAL APPLICABILITY

The magnetoelectric transducer is provided which is configured such that the leads with at least two thicknesses are mounted on the internal electrodes formed on the substrate; the magneto-sensitive section, the internal electrodes and the leads formed at least on the substrate are sealed with the resin; the surface of each lead in the first thickness region is exposed to constitute the electrical connecting terminal to the outside; and the cross section of each lead with the inconstant thickness between the minimum thickness and the maximum thickness of the lead is exposed to the side; and that the magnetoelectric transducer is very small and thin, a pass/fail test of the package can be made without breaking the element, and the electrodes can be formed easily.

What is claimed is:

1. A magnetoelectric transducer comprising:
   a substrate;
   a magneto-sensitive section supported by said substrate;
   internal electrodes formed on said magneto-sensitive section;
   leads mounted on the internal electrodes, each of the leads including at least a first thickness region that is a first portion of the leads from a top surface to a bottom surface and a second thickness region that is a second portion of the leads from the top surface to another surface and formed inside of the first thickness region, where the first thickness is greater than the second thickness;
   a non-conductive resin layer disposed on a side of said magnetoelectric transducer opposite from said substrate, wherein the non-conductive resin layer is configured for sealing said leads, the magneto-sensitive section, and the internal electrodes, and said non-conductive resin layer is contacting the second thickness region; and
   external conducting terminals formed on an exposed surface of the first thickness region of said leads.

2. The magnetoelectric transducer as claimed in claim 1, wherein sides at which said internal electrodes are electrically connected to said leads are sealed by a resin.

3. The magnetoelectric transducer as claimed in claim 1, wherein cross sections of said leads with inconstant thickness ranging from a minimum thickness to a maximum thickness of said leads are exposed at side surfaces and covered by said external connecting terminals at said side surfaces.

4. The magnetoelectric transducer as claimed in claim 3, wherein surfaces of said leads have a vertical cross section with a thickness equal to the first thickness of said leads between at least a portion of said external connecting terminals not at said side surfaces and said internal electrodes.

5. The magnetoelectric transducer as claimed in claim 4, wherein said leads have no portions protruding from the sides, and the sides of said leads each have a side surface consisting of a cut cross section.

6. The magnetoelectric transducer as claimed in claim 1, wherein at least said exposed surfaces of said leads are covered with a metal coating forming said external conductive terminals.

7. The magnetoelectric transducer as claimed in claim 1, wherein said internal electrodes are electrically connected to said leads via a conductive resin or metal.

8. The magnetoelectric transducer as claimed in claim 1, wherein said substrate is composed of a high-permeability magnetic material, and wherein a surface of said high-permeability magnetic material is covered with a magneto-sensitive thin film, a high-permeability magnetic chip is mounted on said magneto-sensitive thin film, and said magneto-sensitive thin film is sandwiched by said substrate composed of the high-permeability magnetic material and said high-permeability magnetic chip.

9. The magnetoelectric transducer as claimed in claim 8, wherein said high-permeability magnetic chip mounted on said magneto-sensitive thin film has a thickness equal to or less than the first thickness of said leads, and is interposed into a space between planes of said leads.

10. The magnetoelectric transducer as claimed in claim 1, wherein said substrate is composed of a nonmagnetic substrate such as an inorganic substrate, glass substrate and semiconductor substrate, and is covered with a magneto-sensitive thin film.

11. The magnetoelectric transducer as claimed in claim 1, wherein said substrate is composed of a semiconductor substrate in which semiconductor elements are formed, and said semiconductor substrate has a magneto-sensitive thin film formed thereon.

12. The magnetoelectric transducer as claimed in claim 11, wherein said magneto-sensitive thin film is formed by doping.

13. The magnetoelectric transducer as claimed in claim 11, wherein said substrate is a semiconductor substrate including the semiconductor elements and a magneto-sensitive section formed by doping.

14. The magnetoelectric transducer as claimed in claim 1, wherein said magneto-sensitive section has a distortion buffer layer formed thereon, on which said resin is further formed.

15. The magnetoelectric transducer as claimed in claim 1, wherein said magnetoelectric transducer is nearly rectangular, and said surfaces of the leads are parallel to a surface of the rectangular, and are also parallel to another surface of said transducer that constitutes a mounting surface.

16. The magnetoelectric transducer as claimed in claim 1, wherein said magnetoelectric transducer is nearly rectangular, and said surfaces of the leads are parallel to a surface of the rectangular, and the exposed portions of the leads on the side cut.

17. The magnetoelectric transducer as claimed in claim 16, wherein cut exposed sections of said leads are covered with metal coating.

18. The magnetoelectric transducer of claim 1, wherein the non-conductive resin layer is configured for sandwiching said magneto-sensitive section between said non-conductive resin layer and said substrate.

* * * * *